(12) United States Patent
Kim et al.

(10) Patent No.: US 11,444,144 B2
(45) Date of Patent: Sep. 13, 2022

(54) DISPLAY DEVICE

(71) Applicant: Samsung Display Co., Ltd., Yongin-si (KR)

(72) Inventors: Keonwoo Kim, Cheonan-si (KR); Deukjong Kim, Cheonan-si (KR); Dong-Hyun Lee, Suwon-si (KR); Deok-Young Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 177 days.

(21) Appl. No.: 16/856,918

(22) Filed: Apr. 23, 2020

(65) Prior Publication Data

US 2020/0350390 A1 Nov. 5, 2020

(30) Foreign Application Priority Data

May 2, 2019 (KR) .......................... 10-2019-0051270

(51) Int. Cl.
*H01L 27/32* (2006.01)
*H01L 51/52* (2006.01)

(52) U.S. Cl.
CPC ........ *H01L 27/3276* (2013.01); *H01L 27/323* (2013.01); *H01L 27/3258* (2013.01); *H01L 51/5253* (2013.01); *H01L 2251/301* (2013.01)

(58) Field of Classification Search
CPC ............... H01L 27/3276; H01L 27/323; H01L 27/3258; H01L 51/5253; H01L 2251/301; H01L 27/3246; H01L 27/3248; H01L 27/3262; H01L 27/3279; H01L 27/3244; H01L 51/5203; H01L 51/5237; G02F 1/13629; G02F 1/136286; G02F 1/13458
See application file for complete search history.

(56) References Cited

U.S. PATENT DOCUMENTS

| | | | |
|---|---|---|---|
| 8,040,051 B2 | 10/2011 | Kim | |
| 2012/0146085 A1 | 6/2012 | Park et al. | |
| 2018/0129352 A1* | 5/2018 | Kim | ...................... G06F 3/0446 |
| 2018/0314098 A1 | 11/2018 | Saitoh et al. | |
| 2018/0358413 A1 | 12/2018 | Lee et al. | |

(Continued)

FOREIGN PATENT DOCUMENTS

| | | |
|---|---|---|
| KR | 10-0846711 B1 | 7/2008 |
| KR | 10-2016-0007407 A | 1/2016 |

(Continued)

*Primary Examiner* — Kyoung Lee
(74) *Attorney, Agent, or Firm* — Lewis Roca Rothgerber Christie LLP

(57) ABSTRACT

A display device includes first and second signal lines, first and second signal pads, and a pad insulating layer overlapping with the first and second signal lines. The first signal pad includes an intermediate conductive pattern overlapping with and connected to an end portion of the first signal line, and an upper conductive pattern on the intermediate conductive pattern, the upper conductive pattern being exposed through the pad insulating layer. The intermediate conductive pattern includes a first portion overlapping with the end portion of the first signal line, and a second portion between the end portion of the first signal line and an end portion of the second signal line and extending from the first portion. The upper conductive pattern is connected to the second portion of the intermediate conductive pattern.

23 Claims, 23 Drawing Sheets

(56) References Cited

U.S. PATENT DOCUMENTS

2019/0006431 A1  1/2019  Won et al.
2019/0096979 A1  3/2019  Jo et al.
2020/0356214 A1  11/2020  Kim et al.

FOREIGN PATENT DOCUMENTS

KR   10-2018-0133706 A   12/2018
KR   10-2019-0003184 A    1/2019
KR   10-2020-0129211 A   11/2020

* cited by examiner

US 11,444,144 B2

DISPLAY DEVICE

CROSS-REFERENCE TO RELATED APPLICATION

This application claims priority to and the benefit of Korean Patent Application No. 10-2019-0051270, filed on May 2, 2019, the content of which is hereby incorporated by reference in its entirety.

BACKGROUND

1. Field

Aspects of one or more exemplary embodiments of the present disclosure relate to a display device. One or more exemplary embodiments of the present disclosure relate to a pad area of a display device.

2. Description of the Related Art

Various display devices that are used for multimedia devices, such as televisions, mobile phones, tablet computers, navigation devices, and game devices, are being developed. The display devices include a keyboard or a mouse as an input device. In addition, the display devices include an input sensor, such as a touch panel, as an input device.

The display devices include a display panel and a circuit board. The display panel is connected to a main board via the circuit board.

The above information disclosed in this Background section is for enhancement of understanding of the background of the present disclosure, and therefore, it may contain information that does not constitute prior art.

SUMMARY

One or more exemplary embodiments of the present disclosure are directed to a display device including signal pads with reduced defects.

According to one or more exemplary embodiments, a display device includes: a base layer; a plurality of electronic elements on the base layer; a plurality of signal lines electrically connected to the electronic elements; a plurality of signal pads, each of the signal pads being connected to a corresponding signal line from among the plurality of signal lines; and a pad insulating layer. Each of the signal pads includes: a first conductive pattern overlapping with an end portion of the corresponding signal line and contacted to the end portion of the corresponding signal line; a second conductive pattern on the first conductive pattern, the second conductive pattern overlapping with the first conductive pattern and contacted to the first conductive pattern; and a third conductive pattern on the second conductive pattern, the third conductive pattern overlapping with the second conductive pattern and contacted to the second conductive pattern. One of the first conductive pattern and the second conductive pattern includes: a first portion overlapping with the end portion of the corresponding signal line; and a second portion between the end portion of the corresponding signal line and an end portion of another signal line that is adjacent to the corresponding signal line from among the signal lines, the second portion extending from the first portion. The pad insulating layer overlaps with the electronic elements, the signal lines, and the first conductive pattern, and has a pad contact hole to expose at least a portion of the second conductive pattern. The third conductive pattern is connected to the second conductive pattern through the pad contact hole.

In exemplary embodiments, the third conductive pattern may be located within the pad contact hole in a plan view.

In exemplary embodiments, the display device may further include: a first insulating layer on the end portion of the corresponding signal line; and a second insulating layer on the first conductive pattern. The first insulating layer may have a first contact hole to expose the end portion of the corresponding signal line; the first conductive pattern may be connected to the end portion of the corresponding signal line through the first contact hole; the second insulating layer may have a second contact hole to expose the first conductive pattern; and the second conductive pattern may be connected to the first conductive pattern through the second contact hole.

In exemplary embodiments, the first conductive pattern may include the first portion and the second portion, and the second contact hole may overlap with the second portion of the first conductive pattern in a plan view.

In exemplary embodiments, the second conductive pattern may include the first portion and the second portion; the second contact hole may overlap with the first conductive pattern and the first portion of the second conductive pattern in a plan view; and the pad contact hole may overlap with the second portion of the second conductive pattern.

In exemplary embodiments, the display device may further include: a first insulating layer; a second insulating layer; a third insulating layer; and a fourth insulating layer. Each of the first, second, third, and fourth insulating layers may be located under the pad insulating layer, the plurality of electronic elements may include an upper electrode, a transistor, and a light emitting element connected to the transistor, the transistor may include an active region, a gate on the active region, a source extending from one side of the active region, and a drain extending from another side of the active region, the first insulating layer may cover the active region, the source, and the drain, the second insulating layer may be on the first insulating layer and may cover the gate, the third insulating layer may be on the second insulating layer and may cover the upper electrode, and the fourth insulating layer may cover the third insulating layer.

In exemplary embodiments, the end portion may be on a same layer as that of the gate or the upper electrode.

In exemplary embodiments, the first conductive pattern is on the third insulating layer, and the second conductive pattern is on the fourth insulating layer.

In exemplary embodiments, the pad insulating layer may include an organic layer, the organic layer including a first portion between the end portion of the corresponding signal line and the end portion of the other signal line, and a second portion overlapping with the transistor, and a thickness of the first portion of the organic layer may be in a range from about 45% to about 55% of a thickness of the second portion of the organic layer.

In exemplary embodiments, each of the first insulating layer, the second insulating layer, the third insulating layer, and the fourth insulating layer may include an inorganic layer, and the pad insulating layer may include an organic layer.

In exemplary embodiments, the display device may further include a thin film encapsulation layer and an input sensor. The electronic elements may include light emitting elements; the thin film encapsulation layer may be on the pad insulating layer and may cover the light emitting elements; and the input sensor may be on the thin film encapsulation layer, the input sensor including sensing electrodes.

In exemplary embodiments, the signal lines may include first signal lines connected to the light emitting elements, and second signal lines connected to the sensing electrodes.

In exemplary embodiments, the signal lines may include a plurality of portions on different layers.

In exemplary embodiments, the signal pads may include first signal pads and second signal pads; the first signal pads may form a first pad row; the second signal pads may form a second pad row different from the first pad row; and the second signal pads may be in a staggered arrangement with respect to the first signal pads.

In exemplary embodiments, the second signal pads may be closer to an edge of the base layer than the first signal pads, and a signal line connected to one of the second signal pads from among the signal lines may overlap with a second portion of a corresponding first signal pad from among the first signal pads.

In exemplary embodiments, the end portion of the signal line connected to one of the second signal pads from among the signal lines may be on a layer different from a layer at which the end portion of the signal line connected to one of the first signal pads from among the signal lines is on.

In exemplary embodiments, the display device may further include: a circuit board electrically connected to the signal pads; and an anisotropic conductive film configured to couple the signal pads to the circuit board.

According to one or more exemplary embodiments, a display device includes: a first signal line; a second signal line; a first signal pad connected to the first signal line; a second signal pad connected to the second signal line; and a pad insulating layer overlapping with the first signal line and the second signal line. The first signal pad includes: an intermediate conductive pattern overlapping with an end portion of the first signal line, the intermediate conductive pattern being connected to the end portion of the first signal line; and an upper conductive pattern on the intermediate conductive pattern, the upper conductive pattern being exposed through the pad insulating layer. The intermediate conductive pattern includes a first portion overlapping with the end portion of the first signal line, and a second portion between the end portion of the first signal line and an end portion of the second signal line, the second portion extending from the first portion, and the upper conductive pattern is connected to the second portion of the intermediate conductive pattern.

In exemplary embodiments, the upper conductive pattern may not overlap with each of the end portion of the first signal line and the end portion of the second signal line.

According to one or more exemplary embodiments, a display device includes: a base layer including a display area and a non-display area; a first switching transistor on the display area; a second switching transistor on the display area; a first signal line connected to the first switching transistor; a second signal line connected to the second switching transistor; a first signal pad connected to the first signal line; a second signal pad connected to the second signal line; and a pad insulating layer overlapping with the first switching transistor, the second switching transistor, the first signal line, and the second signal line. Each of the first signal pad and the second signal pad includes: an intermediate conductive pattern overlapping with an end portion of a corresponding signal line from among the first signal line and the second signal line, the intermediate conductive pattern being electrically connected to the end portion of the corresponding signal line; and an upper conductive pattern on the intermediate conductive pattern, the upper conductive pattern being exposed through the pad insulating layer. The pad insulating layer has a pad contact hole to expose a portion of the intermediate conductive pattern, the pad contact hole overlapping with the end portion of the corresponding signal line, and the upper conductive pattern is connected to the intermediate conductive pattern through the pad contact hole, the upper conductive pattern being located within the pad contact hole in a plan view.

In exemplary embodiments, the pad insulating layer may include an organic layer, the organic layer including a first portion between the first signal pad and the second signal pad, and a second portion overlapping with the first switching transistor, and a thickness of the first portion of the organic layer may be in a range from about 60% to about 80% of a thickness of the second portion of the organic layer.

In exemplary embodiments, the pad insulating layer may include a first organic layer, at least one inorganic layer on the first organic layer, and a second organic layer on the at least one inorganic layer. The first organic layer may include a first portion between the first signal pad and the second signal pad, and a second portion overlapping with the first switching transistor. A thickness of the first portion of the first organic layer may be in a range from about 45% to about 55% of a thickness of the second portion of the first organic layer.

In exemplary embodiments, the pad insulating layer may include at least one inorganic layer and an organic layer on the at least one inorganic layer, and an upper surface of a portion between the first signal pad and the second signal pad of the organic layer may be higher than an uppermost end of the upper conductive pattern.

According to the above, because the upper conductive pattern is disposed between the end portion of the corresponding signal line and the end portion of the adjacent signal line, the uppermost pattern of the signal pad may not overlap with the end portion of the corresponding signal line. When viewed in the cross-sectional view, the upper conductive pattern is disposed lower than the upper surface of the pad insulating layer. The portion of the pad insulating layer overlapping with the end portion of the corresponding signal line has a function of a barrier to prevent or substantially prevent the upper conductive patterns from shorting with each other.

The upper conductive patterns may be prevented or substantially prevented from shorting with each other by adjusting the thickness of the portion of the pad insulating layer that is disposed between the end portions of the signal line. The portion of the pad insulating layer has the function of the barrier. The barrier that prevents or substantially prevents the upper conductive patterns from shorting with each other is formed from the pad insulating layer by controlling a stacked structure of the pad insulating layer or adjusting the thickness of the organic layer.

BRIEF DESCRIPTION OF THE DRAWINGS

The above and other aspects and features of the present disclosure will be more clearly understood from the following detailed description of the illustrative, non-limiting example embodiments with reference to the accompanying drawings in which.

DETAILED DESCRIPTION

Figure 1:
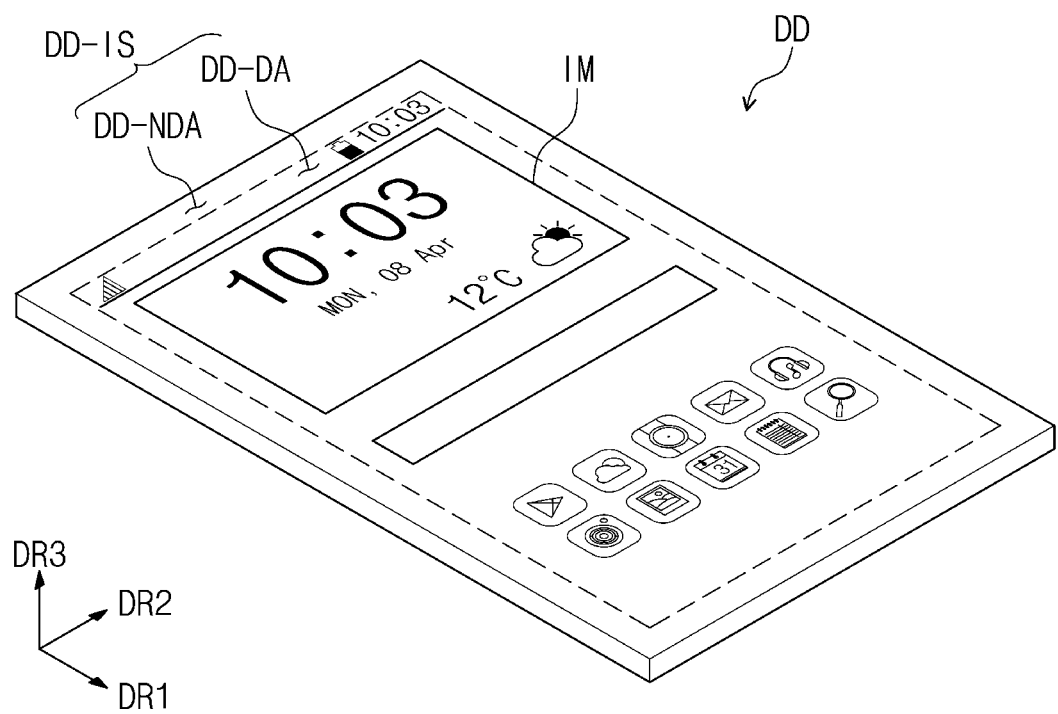
FIG. 1 is a perspective view illustrating a display device according to an exemplary embodiment of the present disclosure.

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the thicknesses, ratios, dimensions, and relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
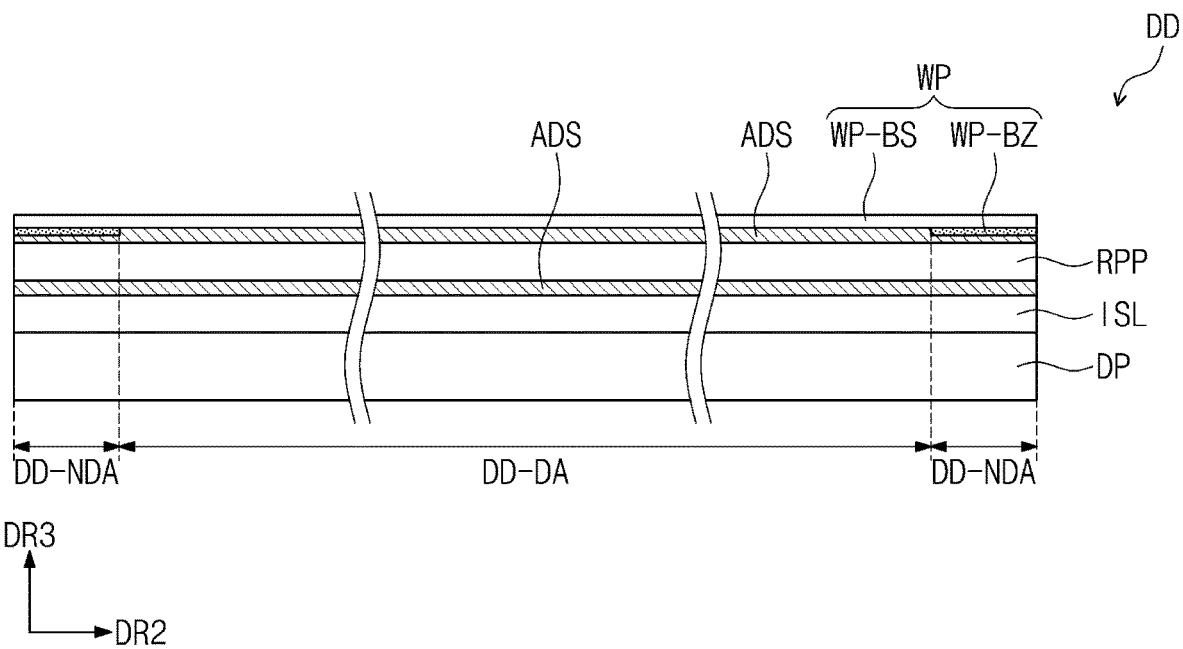
FIG. 2 is a cross-sectional view illustrating a display device according to an exemplary embodiment of the present disclosure.

FIG. 1 is a perspective view illustrating a display device DD according to an exemplary embodiment of the present disclosure. FIG. 2 is a cross-sectional view illustrating the display device DD according to an exemplary embodiment of the present disclosure.

As illustrated in FIG. 1, the display device DD displays an image IM at (e.g., through) a display surface DD-IS. The display surface DD-IS may be parallel or substantially parallel to a surface defined by a first direction DR1 and a second direction DR2. A third direction DR3 indicates a normal line direction of the display surface DD-IS (e.g., a thickness direction of the display device DD).

Front (or upper) and rear (or lower) surfaces of each member or each unit described below are distinguished from each other by the third direction DR3. However, directions indicated by the first, second, and third directional axes DR1, DR2, and DR3 are merely exemplary. Hereinafter, first, second, and third directions correspond to the directions indicated by the first, second, and third directional axes DR1, DR2, and DR3, respectively, and are assigned the same reference numerals as the first, second, and third directional axes DR1, DR2, and DR3.

In an exemplary embodiment of the present disclosure, the display device DD includes a flat display surface. However, the present disclosure is not limited thereto. For example, in another exemplary embodiment, the display device DD may include a curved display surface. In another example, the display device DD may include a three-dimensional display surface. The three-dimensional display surface may include a plurality of display areas indicating different directions from each other, for example, a polygonal column-shaped display surface.

In an exemplary embodiment, the display device DD may be a rigid display device, but the present disclosure is not limited thereto. For example, in another exemplary embodiment, the display device DD may be a flexible display device DD. The flexible display device DD may include a foldable display device or a bending kind of display device that may be partially bent.

For convenience, the display device DD is illustrated in FIG. 1 as a part of a mobile phone terminal as a representative example. Although not illustrated in the figures, one or more of electronic modules, a camera module, and/or a power module, which may be mounted on a main board, may be arranged on a bracket or a case with the display device DD to form the mobile phone terminal. However, the present disclosure is not limited thereto, and the display device DD according to various embodiments of the present disclosure may be applied to a large-sized electronic item, such as a television set, a monitor, and/or the like, and/or a small or medium-sized electronic item, such as a tablet computer, a car navigation unit (e.g., a car navigation device), a game unit (e.g., a game console), a smart watch, and/or the like.

As illustrated in FIG. 1, the display surface DD-IS includes an image area DD-DA at (e.g., through) which the image IM is displayed, and a bezel area DD-NDA defined adjacent to (e.g., around a periphery of) the image area DD-DA. The image IM is not displayed at or through the bezel area DD-NDA. FIG. 1 illustrates icon images as a representative example of the image IM.

As illustrated in FIG. 1, the image area DD-DA may have a quadrangular shape or substantially a quadrangular shape. The expression "substantially quadrangular shape" as used in this specification may refer to not only a quadrangular shape as mathematically defined, but also a quadrangular shape in which a curved line boundary is defined at or in a vertex area (or a corner area) instead of a vertex.

The bezel area DD-NDA may surround (e.g., may be around a periphery of) the image area DD-DA, but the present disclosure is not limited thereto. The image area DD-DA and the bezel area DD-NDA may have various different suitable shapes. The bezel area DD-NDA may be defined at only one side of the image area DD-DA. The bezel area DD-NDA may not be exposed to the outside depending on a combination between the display device DD and other components of an electronic device.

FIG. 2 illustrates the cross-section defined by the second direction DR2 and the third direction DR3. Components of the display device DD are schematically illustrated to show their stacking relationship.

The display device DD according to an exemplary embodiment of the present disclosure may include a display panel DP, an input sensor ISL, an anti-reflector RPP, and a window WP. At least some components of the display panel DP, the input sensor ISL, the anti-reflector RPP, and the window WP may be formed through successive processes or may be attached to each other by an adhesive member (e.g., an adhesive or adhesive layer). The adhesive member ADS may be a transparent adhesive member (e.g., a transparent adhesive layer), such as a pressure sensitive adhesive (PSA) film, an optically clear adhesive (OCA) film, an optically clear resin (OCR), and/or the like. The adhesive member described hereinafter may include an adhesive or pressure sensitive adhesive. In an exemplary embodiment of the present disclosure, the anti-reflector RPP and/or the window WP may be omitted or may be replaced with other components.

As illustrated in FIG. 2, among the input sensor ISL, the anti-reflector RPP, and the window WP, the input sensor ISL may be formed with the display panel DP through successive processes, and may be directly disposed on the display panel DP. As used in the present disclosure, the expression "component B is directly disposed on component A" refers to a case where no intervening elements (such as a separate adhesive layer or adhesive member, for example) are present between the component "B" and the component "A." For example, the component "B" may be formed on a base surface provided by the component "A" through successive processes after the component "A" is formed.

In an exemplary embodiment, the anti-reflector RPP and the window WP may be a "panel" type component, and the input sensor ISL may be a "layer" type component. As used in the present disclosure, a "panel" type component includes a base layer providing a base surface (e.g., a synthetic resin film, a composite film, a glass substrate, or the like), whereas for a "layer" type component, the base layer may be omitted. In other words, components that are referred to as a "layer" type component may be disposed on a base surface provided by another component. In another exemplary embodiment, the anti-reflector RPP and the window WP may be a "layer" type component.

The display panel DP generates the image, and the input sensor ISL obtains coordinate information of an external input (e.g., touch event). Although not illustrated separately, the display device DD according to an exemplary embodiment of the present disclosure may further include a protective member disposed on a lower surface of the display panel DP. The protective member and the display panel DP may be coupled to each other by the adhesive member.

The display panel DP according to an exemplary embodiment of the present disclosure may be a light emitting type of display panel, but the present disclosure is not limited thereto. For example, the display panel DP may include or be an organic light emitting display panel or a quantum dot light emitting display panel. The panels are distinct from each other depending on a material of a light emitting element. A light emitting layer of the organic light emitting display panel may include an organic light emitting material. A light emitting layer of the quantum dot light emitting display panel may include a quantum dot and/or a quantum rod. Hereinafter, the organic light emitting display panel will be described as a representative example of the display panel DP.

The anti-reflector RPP reduces a reflectance of an external light incident thereto from above the window WP. The anti-reflector RPP according to an exemplary embodiment of the present disclosure may include a retarder and a polarizer. The retarder may be a film type retarder or a liquid crystal coating type retarder, and may include a half-wave retarder (e.g., a $\lambda/2$ retarder) and/or a quarter-wave retarder (e.g., a $\lambda/4$ retarder). The polarizer may be a film type polarizer or a liquid crystal coating type polarizer. The film type retarder and/or polarizer may include a stretching type synthetic resin film, and the liquid crystal coating type retarder and/or polarizer may include liquid crystals arranged in an arrangement (e.g., a predetermined arrangement). The polarizer and/or the retarder may further include a protective film. The retarder and/or the polarizer or the protective film may be defined as a base layer of the anti-reflector RPP.

The anti-reflector RPP according to an exemplary embodiment of the present disclosure may include color filters. The color filters may have an arrangement (e.g., a predetermined arrangement). The arrangement of the color filters may be determined by taking into account emission colors of pixels included in the display panel DP. The anti-reflector RPP may further include a black matrix that is disposed adjacent to the color filters.

The anti-reflector RPP according to an exemplary embodiment of the present disclosure may include a destructive interference structure. For example, the destructive interference structure may include a first reflection layer and a second reflection layer, which may be disposed at (e.g., on or in) different layers from each other. A first reflection light and a second reflection light, which are reflected by the first reflection layer and the second reflection layer, respectively, may be destructively interfered, and thus, the reflectance of the external light may be reduced.

The window WP according to an exemplary embodiment of the present disclosure includes a base layer WP-BS and a light shielding pattern WP-BZ. The base layer WP-BS may include a glass substrate and/or a synthetic resin film. The base layer WP-BS may include a single-layer structure or a multi-layer structure. For example, the base layer WP-BS may include two or more films coupled to each other by the adhesive member.

The light shielding pattern WP-BZ partially overlaps with the base layer WP-BS. The light shielding pattern WP-BZ is disposed on a rear surface of the base layer WP-BS, and the light shielding pattern WP-BZ defines or substantially defines the bezel area DD-NDA of the display device DD. An area at (e.g., in or on) which the light shielding pattern WP-BZ is not disposed may define the image area DD-DA of the display device DD. In the case of the window WP, the area in which the light shielding pattern WP-BZ is disposed may be defined as a light shielding area, and the area in which the light shielding pattern WP-BZ is not disposed may be defined as a transmission area.

The light shielding pattern WP-BZ may have a multi-layer structure. The multi-layer structure may include a chromatic color layer and an achromatic (e.g., black color) light shielding layer. The chromatic color layer and the achromatic light shielding layer may be formed through a deposition process, a printing process, and/or a coating process. Although not illustrated in the figures, the window WP may further include a functional coating layer disposed on a front surface of the base layer WP-BS. The functional coating layer may include one or more of an anti-fingerprint layer, an anti-reflective layer, and/or a hard coating layer.

Figure 3:
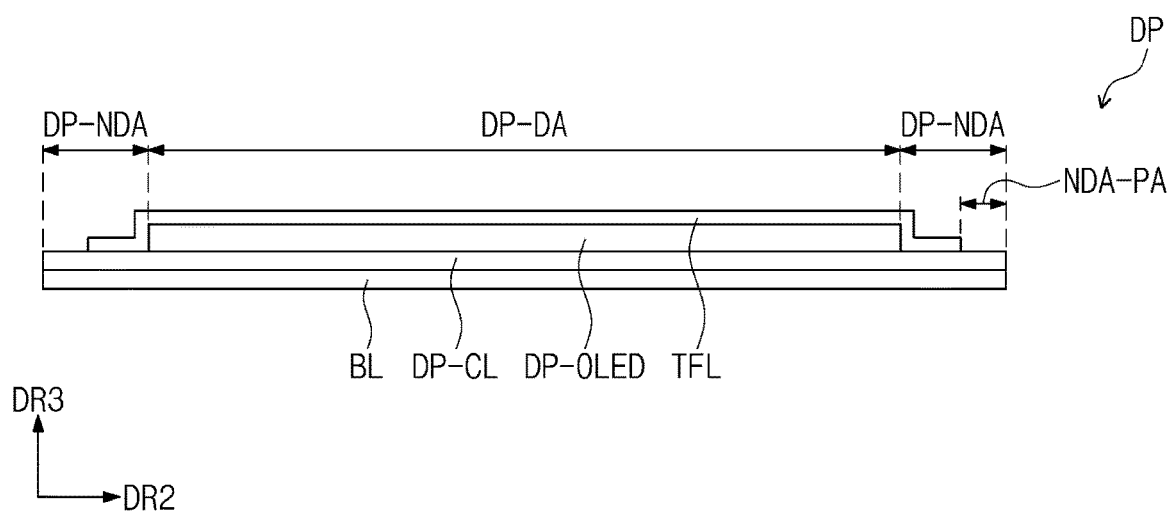
FIG. 3 is a cross-sectional view illustrating a display panel according to an exemplary embodiment of the present disclosure.
Figure 4A:
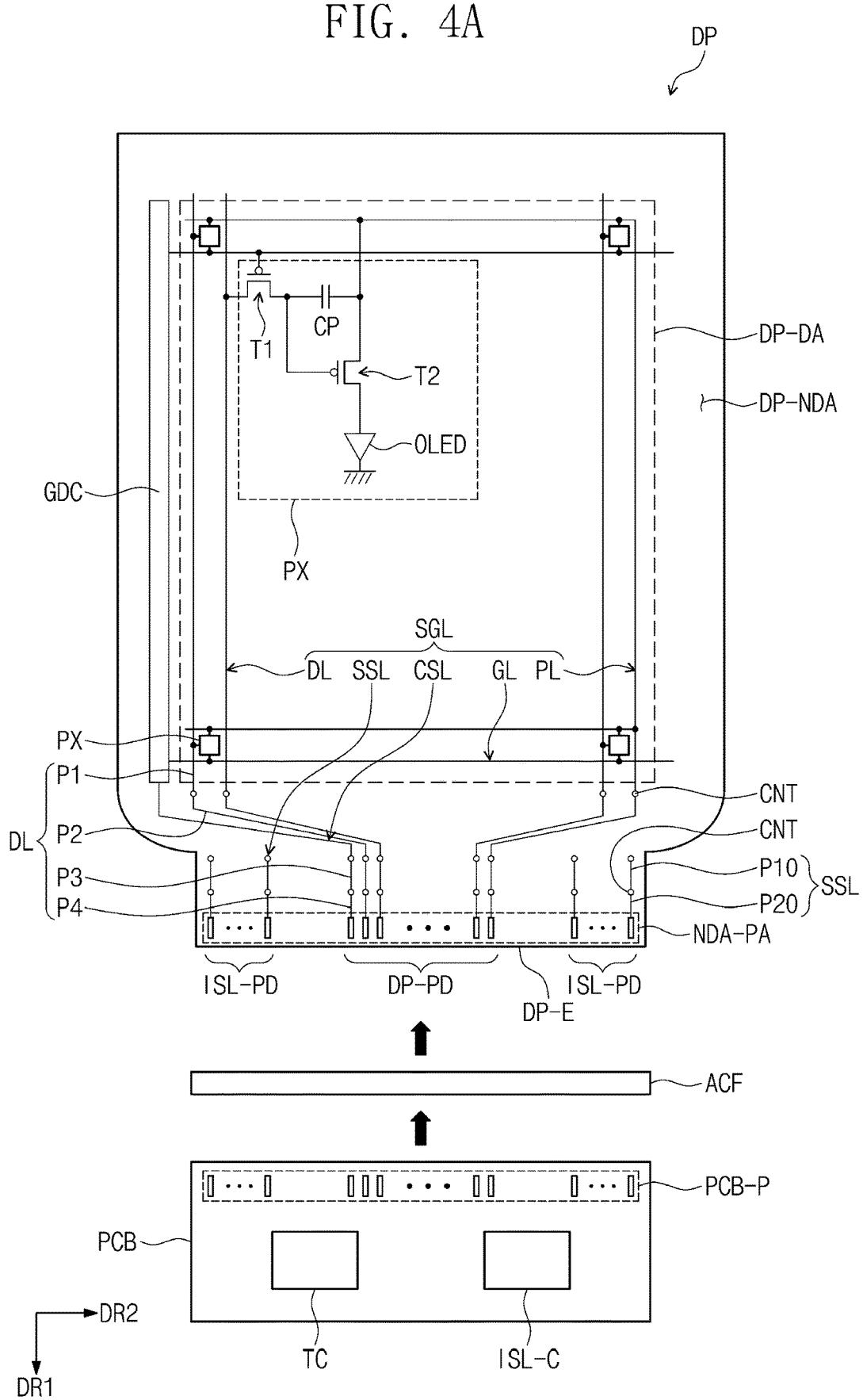
FIGS. 4A and 4B are plan views illustrating a display panel according to one or more exemplary embodiments of the present disclosure.
Figure 4B:
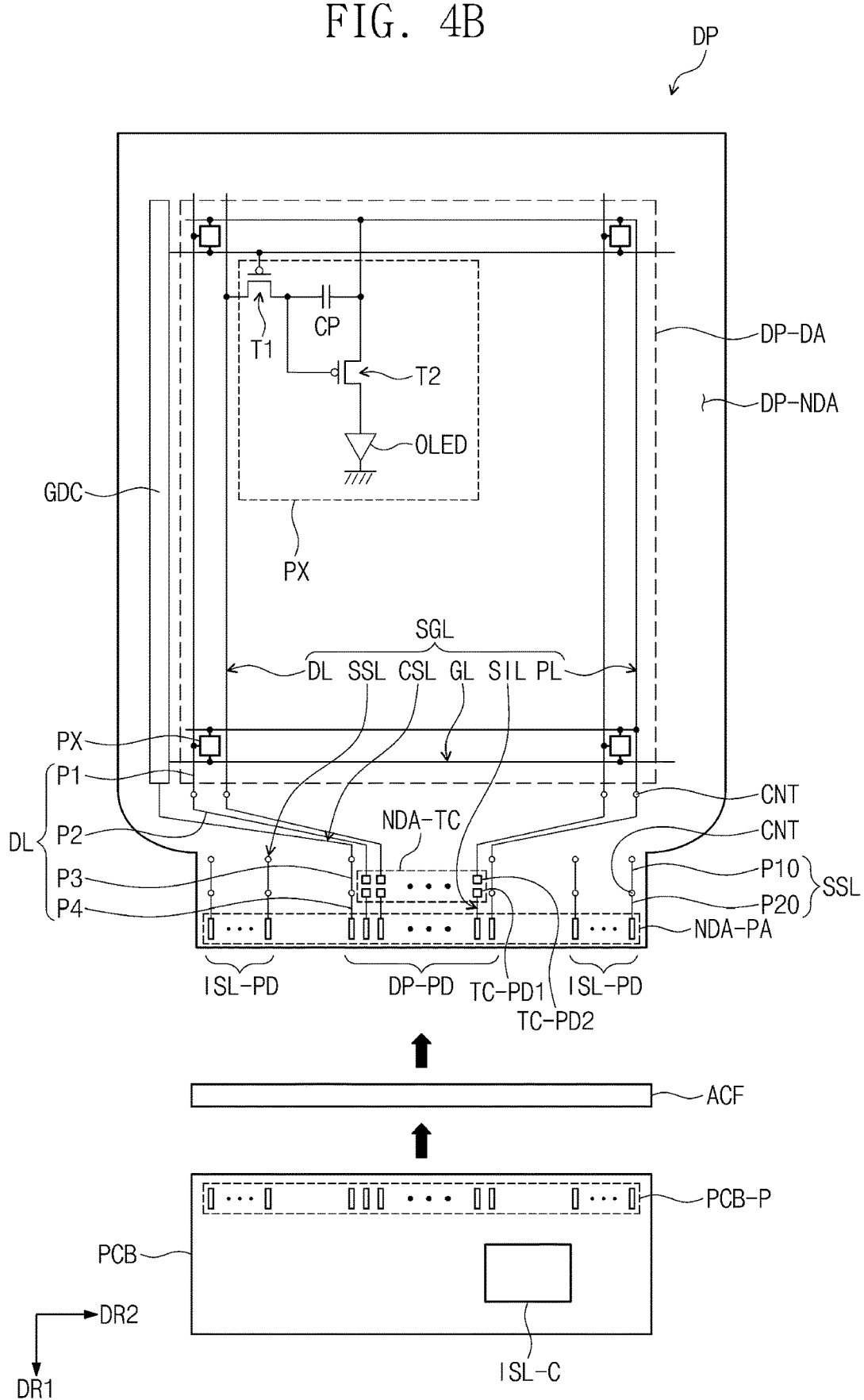

FIG. 3 is a cross-sectional view illustrating the display panel DP according to an exemplary embodiment of the present disclosure. FIGS. 4A and 4B are plan views illustrating the display panel DP according to one or more exemplary embodiments of the present disclosure.

Referring to FIG. 3, the display panel DP includes a base layer BL, a circuit element layer DP-CL disposed on the base layer BL, a display element layer DP-OLED, and an upper insulating layer TFL. A display area DP-DA and a non-display area DP-NDA, which may correspond to the image area DD-DA and the bezel area DD-NDA illustrated in FIG. 1, respectively, may be defined at (e.g., in or on) the display panel DP. As used in the present disclosure, the expression "an area/portion corresponds to another area/portion" refers to areas/portions that overlap with each other, and is not limited to areas/portions that have the same size and/or the same shape as each other.

The base layer BL may include at least one synthetic resin film. The base layer BL may include a glass substrate, a metal substrate, and/or an organic/inorganic composite substrate.

The circuit element layer DP-CL includes at least one insulating layer and a circuit element. The insulating layer includes at least one inorganic layer and at least one organic layer. The circuit element includes signal lines and a pixel driving circuit.

The display element layer DP-OLED includes at least one or more organic light emitting diodes as light emitting elements. The display element layer DP-OLED may further include an organic layer, for example, such as a pixel definition layer.

The upper insulating layer TFL includes a plurality of thin layers. Some of the thin layers (e.g., at least one of the thin layers) of the upper insulating layer TFL may improve an optical efficiency, and some of the thin layers (e.g., at least one of the thin layers) of the upper insulating layer TFL may protect the organic light emitting diodes. The upper insulating layer TFL will be described in more detail below.

As illustrated in FIGS. 4A and 4B, the display panel DP includes a driving circuit GDC, a plurality of signal lines SGL (hereinafter, referred to as "signal lines"), a plurality of signal pads DP-PD and ISL-PD (hereinafter, referred to as "signal pads"), and a plurality of pixels PX (hereinafter, referred to as "pixels").

The driving circuit GDC includes a scan driving circuit. The scan driving circuit generates a plurality of scan signals (hereinafter, referred to as "scan signals"), and outputs (e.g., sequentially outputs) the scan signals to a plurality of scan lines GL (hereinafter, referred to as "scan lines"). The scan driving circuit may further output other control signals to the driving circuit of the pixels PX.

The scan driving circuit may include a plurality of transistors, and the transistors may be formed through the same or substantially the same processes as those of the driving circuit of the pixels PX (e.g., a low temperature polycrystalline silicon (LTPS) process, a low temperature polycrystalline oxide (LTPO) process, and/or the like).

The signal lines SGL include the scan lines GL, data lines DL, a power line PL, and a control signal line CSL. Each of the scan lines GL is connected to a corresponding pixel from among the pixels PX, and each of the data lines DL is connected to a corresponding pixel from among the pixels PX. The power line PL is connected to the pixels PX. The control signal line CSL provides the scan driving circuit with control signals.

In an exemplary embodiment, the signal lines SGL may further include auxiliary lines SSL. The auxiliary lines SSL may be signal lines that are connected to the input sensor ISL (e.g., refer to FIG. 2). However, the present disclosure is not limited thereto, and in another exemplary embodiment of the present disclosure, the auxiliary lines SSL may be omitted.

The signal lines SGL may include a plurality of portions disposed at (e.g., on or in) different layers from each other. For example, FIG. 4A illustrates the data lines DL including four portions P1, P2, P3, and P4, and the auxiliary lines SSL including two portions P10 and P20. The four portions P1, P2, P3, and P4 of the data lines DL may be connected to each other via contact holes CNT, and the two portions P10 and P20 of the auxiliary lines SSL may be connected to each other via contact holes CNT. A first portion P10 of the auxiliary lines SSL may be connected to a signal line of an input sensor ISL (e.g., refer to FIG. 6B) via the contact holes CNT.

The signal pads DP-PD and ISL-PD may include first signal pads (e.g., a first type of signal pads) DP-PD connected to the data lines DL, the power line PL, and the control signal line CSL, and second signal pads (e.g., a second type of signal pads) ISL-PD connected to the auxiliary lines SSL. The first signal pads DP-PD and the second signal pads ISL-PD may be disposed to be adjacent to each other at (e.g., in or on) a pad area NDA-PA defined at (e.g., in or on) a portion of the non-display area DP-NDA. A stacked structure and/or a material of the first signal pads DP-PD may be the same or substantially the same as (e.g., may not be distinguished from) that of the second signal pads ISL-PD, and the first signal pads DP-PD and the second signal pads ISL-PD may be formed through the same or substantially the same process.

The display area DP-DA may be defined as an area at (e.g., in or on) which the pixels PX are arranged. A plurality of electronic devices may be arranged at (e.g., in or on) the display area DP-DA. The electronic devices may include an organic light emitting diode and a pixel driving circuit connected to the organic light emitting diode, which may be disposed at (e.g., in or on) each pixel PX. The driving circuit GDC, the signal lines SGL, the signal pads DP-PD and ISL-PD, and the pixel driving circuit may be included at (e.g., in or on) the circuit element layer DP-CL (e.g., as illustrated in FIG. 3).

The pixel PX may include, for example, a first transistor T1, a second transistor T2, a capacitor CP, and an organic light emitting diode OLED. However, the present disclosure is not limited thereto, and the pixel PX may include various suitable pixel circuit structures including at least a switching transistor and a driving transistor, for example. The first transistor T1 is connected to the scan line GL and the data line DL. The organic light emitting diode OLED receives a power voltage provided through the power line PL.

FIG. 4A further illustrates a circuit board PCB connected to the display panel DP. The circuit board PCB may be a rigid circuit board or a flexible circuit board.

A timing control circuit TC may be disposed on the circuit board PCB to control an operation of the display panel DP. An input sensing circuit ISL-C may be disposed on the circuit board PCB to control the input sensor ISL. Each of the timing control circuit TC and the input sensing circuit ISL-C may be mounted on the circuit board PCB in an integrated chip form. In an exemplary embodiment of the present disclosure, the timing control circuit TC and the input sensing circuit ISL-C may be mounted on the circuit board PCB in one integrated chip form. The circuit board PCB may include circuit board pads PCB-P electrically connected to the signal pads DP-PD and ISL-PD. Although not illustrated in the figures, the circuit board PCB may further include signals lines that connect the circuit board pads PCB-P to the timing control circuit TC and/or the input sensing circuit ISL-C. In some embodiments, the circuit board pads PCB-P may be output pads, and the circuit board PCB may further include input pads.

The signal pads DP-PD and ISL-PD of the display panel DP may be electrically connected to the circuit board pads PCB-P of the circuit board PCB by a conductive member, such as an anisotropic conductive film ACF. However, the present disclosure is not limited thereto, and in another exemplary embodiment, the anisotropic conductive film ACF may be replaced with a conductive ball.

As illustrated in FIG. 4B, the display panel DP according to an exemplary embodiment of the present disclosure may further include a chip mounting area NDA-TC defined at (e.g., in or on) the non-display area DP-NDA. The timing control circuit TC (e.g., refer to FIG. 4A) may be mounted on the chip mounting area NDA-TC in a chip form.

First chip pads TC-PD1 and second chip pads TC-PD2 may be arranged at (e.g., in or on) the chip mounting area NDA-TC. The first chip pads TC-PD1 may be connected to the data lines DL, and the second chip pads TC-PD2 may be connected to the first signal pads DP-PD via input signal lines SIL. Terminals of the timing control circuit TC may be connected to the first chip pads TC-PD1 and the second chip pads TC-PD2. The data lines DL may be electrically connected to the signal pads DP-PD via the timing control circuit TC. In an exemplary embodiment of the present disclosure, at least one line from among the control signal line CSL and the power line PL may be connected to the timing control circuit TC.

The display panel DP illustrated in FIGS. 4A and 4B may be partially bent. In this case, a portion of the non-display area DP-NDA may be bent with respect to a bending axis that is parallel or substantially parallel to the second direction DR2. The bending axis may be defined to overlap with the third portions P3 of the data lines DL and the first portions P10 of the auxiliary lines SSL.

Figure 5A:
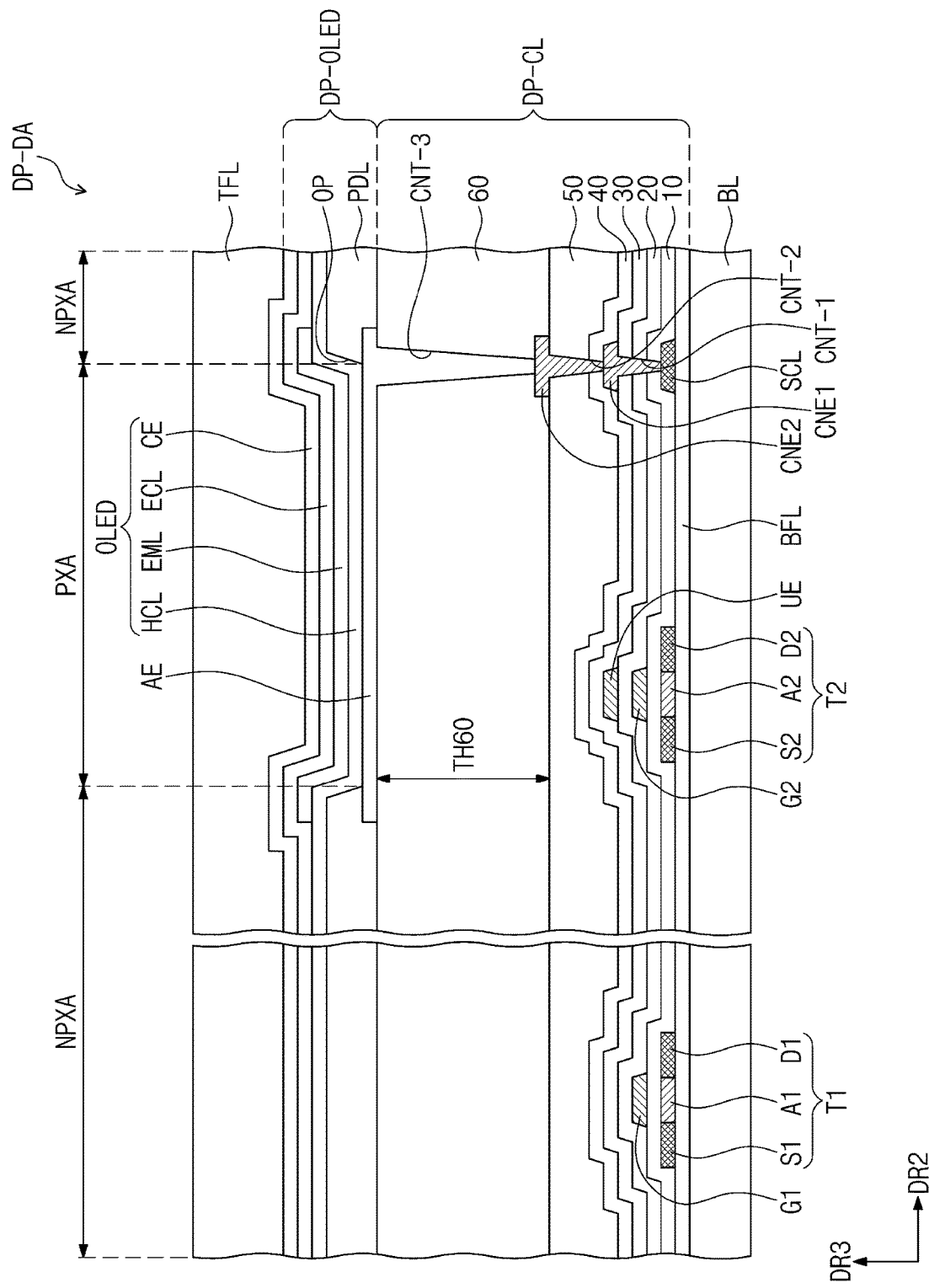
FIG. 5A is an enlarged cross-sectional view illustrating a display panel according to an exemplary embodiment of the present disclosure.
Figure 5B:
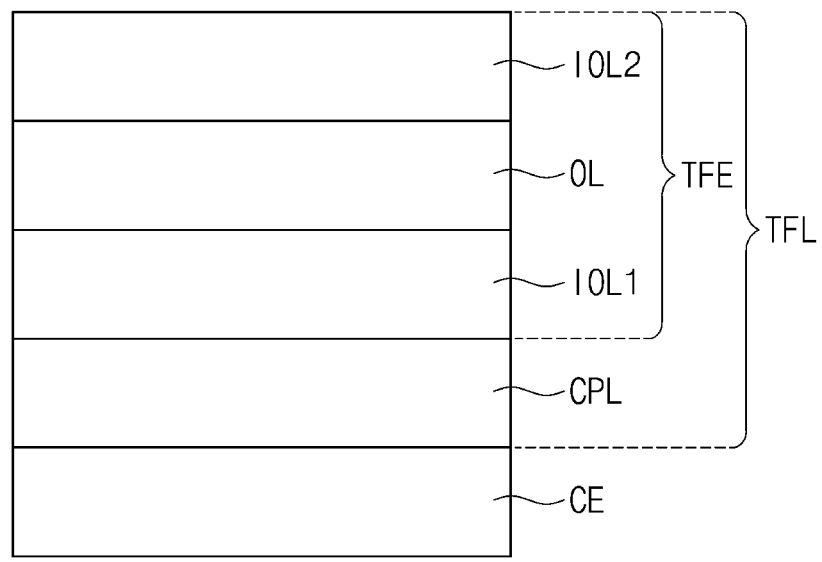
FIG. 5B is an enlarged cross-sectional view illustrating an upper insulating layer according to an exemplary embodiment of the present disclosure.

FIG. 5A is an enlarged cross-sectional view illustrating the display panel DP according to an exemplary embodiment of the present disclosure. FIG. 5B is an enlarged cross-sectional view illustrating the upper insulating layer TFL according to an exemplary embodiment of the present disclosure.

Referring to FIG. 5A, the display panel DP may include a plurality of insulating layers, a semiconductor pattern, a conductive pattern, and a signal line. The insulating layer, semiconductor layer, and a conductive layer may be formed by coating and deposition processes. The insulating layer, the semiconductor layer, and the conductive layer may be patterned (e.g., selectively patterned) by a photolithography process. The semiconductor pattern, the conductive pattern, and the signal line, which are included in the circuit element layer DP-CL and the display element layer DP-OLED, may formed by the above-described method.

The base layer BL may include a synthetic resin film. A synthetic resin layer may include a heat-curable resin. The base layer BL may have a multi-layer structure. For example, the base layer BL may have a three-layer structure including the synthetic resin layer, an adhesive layer, and the synthetic resin layer (e.g., another synthetic resin layer). In more detail, the synthetic resin layer may include or be a polyimide-based resin layer, but the present disclosure is not limited thereto. The synthetic resin layer may include, for example, at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, and/or a perylene-based resin. Further, the base layer BL may include a glass substrate, a metal substrate, and/or an organic/inorganic composite substrate.

At least one inorganic layer may be formed on the upper surface of the base layer BL. The inorganic layer may include, for example, at least one of aluminum oxide, titanium oxide, silicon oxide, silicon oxynitride, zirconium oxide, and hafnium oxide. The inorganic layer may be provided in a plurality of layers. The inorganic layers may form a barrier layer and/or a buffer layer. In an exemplary embodiment, as shown in FIG. 5A, the display panel DP includes a buffer layer BFL.

The buffer layer BFL may improve a coupling force between the base layer BL and the semiconductor pattern. The buffer layer BFL may include a silicon oxide layer and a silicon nitride layer. The silicon oxide layer and the silicon nitride layer may be stacked on (e.g., alternately stacked with) each other.

The semiconductor pattern is disposed on the buffer layer BFL. The semiconductor pattern may include polysilicon, but the present disclosure is not limited thereto. The semiconductor pattern may include amorphous silicon or a metal oxide.

FIG. 5A illustrates a portion of the semiconductor pattern, and the semiconductor pattern may be further disposed on another area of the pixel PX when viewed in a plan view (e.g., on a plane that is parallel or substantially parallel with a top surface of the display panel DP). The semiconductor pattern may be arranged in a specific pattern (or rule) over the pixels PX. For example, the semiconductor pattern may have different electrical properties depending on whether or not it is doped. The semiconductor pattern may include a doped area and a non-doped area. The doped area may be doped with an N-type dopant or a P-type dopant. For example, if one or more of the first and second transistors T1 and T2 (e.g., see FIG. 4A) include a P-type transistor, the P-type transistor includes the doped area of the semiconductor pattern that is doped with the P-type dopant.

The doped area of the semiconductor pattern may have a conductivity that is greater than that of the non-doped area. The doped area of the semiconductor pattern may act or substantially act as an electrode or a signal line. The non-doped area of the semiconductor pattern may correspond or substantially correspond to an active region (or a channel) of a transistor. In other words, a portion of the semiconductor pattern may include or be the active region of the transistor, another portion of the semiconductor pattern may include or be a source or drain of the transistor, and another portion of the semiconductor pattern may be a connection electrode or a connection signal line.

As illustrated in FIG. 5A, a source S1, an active region A1, and a drain D1 of the first transistor T1 may be formed using the semiconductor pattern, and a source S2, an active region A2, and a drain D2 of the second transistor T2 may be formed using the semiconductor pattern. The sources S1 and S2 and the drains D1 and D2 extend in opposite directions from the active regions A1 and A2 in the cross-sectional view. FIG. 5A illustrates a portion of the connection signal line SCL formed using the semiconductor pattern. Although not illustrated separately, the connection signal line SCL may be connected to the drain D2 of the second transistor T2 when viewed in a plan view.

A first insulating layer 10 is disposed on the buffer layer BFL. The first insulating layer 10 overlaps with (e.g., commonly overlaps with) the pixels PX (e.g., refer to FIGS. 4A and 4B) and covers the semiconductor pattern. The first insulating layer 10 may include an inorganic layer and/or an organic layer, and may have a single-layer structure or a multi-layer structure. The first insulating layer 10 may include at least one of, for example, aluminum oxide, titanium oxide, silicon oxide, silicon oxynitride, zirconium oxide, and hafnium oxide. In an exemplary embodiment, as shown in FIG. 5A, the first insulating layer 10 may include or be a single silicon oxide layer. An insulating layer of the circuit element layer DP-CL (described in more detail below) may include an inorganic layer and/or an organic layer, and may have a single-layer structure or multi-layer structure. The inorganic layer may include at least one of the above-described materials.

Gates G1 and G2 are disposed on the first insulating layer 10. The gate G1 may be a portion of a metal pattern. The gates G1 and G2 overlap with the active regions A1 and A2, respectively. The gates G1 and G2 may act as a mask during a doping process of the semiconductor pattern.

A second insulating layer 20 is disposed on the first insulating layer 10 to cover the gates G1 and G2. The second insulating layer 20 overlaps (e.g., commonly overlaps) with the pixels PX (e.g., refer to FIGS. 4A and 4B). The second insulating layer 20 may include an inorganic layer and/or an organic layer, and may have a single-layer structure or multi-layer structure. In an exemplary embodiment, as shown in FIG. 5A, the second insulating layer 20 may be a single silicon oxide layer.

An upper electrode UE may be disposed on the second insulating layer 20. The upper electrode UE may overlap with the gate G2 of the second transistor T2. The upper electrode UE may be a portion of the metal pattern. A portion of the gate G2 and the upper electrode UE overlapping with the portion of the gate G2 may define the capacitor CP (e.g., refer to FIG. 4A). However, the present disclosure is not limited thereto, and in another exemplary embodiment of the present disclosure, the upper electrode UE may be omitted.

A third insulating layer 30 is disposed on the second insulating layer 20 to cover the upper electrode UE. In an exemplary embodiment, as shown in FIG. 5A, the third insulating layer 30 may be a single silicon oxide layer, but the present disclosure is not limited thereto, and the third insulating layer 30 may have another suitable single-layer structure or a multi-layer structure. A first connection electrode CNE1 may be disposed on the third insulating layer 30. The first connection electrode CNE1 may be connected to the connection signal line SCL through a contact hole CNT-1 extending (e.g., penetrating) through the first to third insulating layers 10 to 30.

A fourth insulating layer 40 is disposed on the third insulating layer 30. The fourth insulating layer 40 may include or be a single silicon oxide layer. A fifth insulating layer 50 is disposed on the fourth insulating layer 40. The fifth insulating layer 50 may include or be an organic layer. A second connection electrode CNE2 may be disposed on the fifth insulating layer 50. The second connection electrode CNE2 may be connected to the first connection electrode CNE1 through a contact hole CNT-2 extending (e.g., penetrating) through the fourth and fifth insulating layers 40 and 50.

A sixth insulating layer 60 is disposed on the fifth insulating layer 50 to cover the second connection electrode CNE2. The sixth insulating layer 60 may include or be an organic layer. A first electrode AE is disposed on the sixth insulating layer 60. The first electrode AE is connected to the second connection electrode CNE2 through a contact hole CNT-3 extending (e.g., penetrating) through the sixth insulating layer 60. An opening OP is defined through a pixel definition layer PDL. At least a portion of the first electrode AE is exposed through the opening OP of the pixel definition layer PDL.

As illustrated in FIG. 5A, the display area DP-DA may include a light emitting area PXA and a non-light emitting area NPXA disposed adjacent to the light emitting area PXA. For example, the non-light emitting area NPXA may surround (e.g., may be around a periphery of) the light emitting area PXA. In an exemplary embodiment, the light emitting area PXA is defined to correspond to the portion of the first electrode AE that is exposed through the opening OP.

A hole control layer HCL may be disposed (e.g., commonly disposed) at (e.g., on or in) the light emitting area PXA and the non-light emitting area NPXA. The hole control layer HCL may include a hole transport layer and/or a hole injection layer. A light emitting layer EML may be disposed on the hole control layer HCL. The light emitting layer EML may be disposed at (e.g., in or on) an area corresponding to the opening OP. For example, the light emitting layer EML may be formed at (e.g., in or on) each of the pixels PX after being divided into a plurality of portions.

An electron control layer ECL may be disposed on the light emitting layer EML. The electron control layer ECL may include an electron transport layer and/or an electron injection layer. The hole control layer HCL and the electron control layer ECL may be formed (e.g., commonly formed) at (e.g., in or on) a plurality of pixels PX using an open mask. A second electrode CE may be disposed on the electron control layer ECL. The second electrode CE may have a single unitary form and may be disposed (e.g., commonly disposed) at (e.g., in or on) the plurality of pixels PX (e.g., refer to FIG. 4A).

As illustrated in FIGS. 5A and 5B, the upper insulating layer TFL is disposed on the second electrode CE. The upper insulating layer TFL may include a plurality of thin films. As shown in FIG. 5B, in an exemplary embodiment, the upper insulating layer TFL may include a capping layer CPL and a thin film encapsulation layer TFE. The thin film encapsulation layer TFE may include a first inorganic layer IOL1, an organic layer OL, and a second inorganic layer IOL2.

The capping layer CPL is disposed on the second electrode CE, and may contact the second electrode CE. The capping layer includes an organic material. The first inorganic layer IOL1 is disposed on the capping layer CPL, and may contact the capping layer CPL. The organic layer OL is disposed on the first inorganic layer IOL1, and may contact the first inorganic layer IOL1. The second inorganic layer IOL2 is disposed on the organic layer OL, and may contact the organic layer OL.

The capping layer CPL may protect the second electrode CE from a subsequent process (e.g. a sputtering process), and may improve a light emission efficiency of the organic light emitting diode OLED. The capping layer CPL has a refractive index greater than that of the first inorganic layer IOL1.

The first inorganic layer IOL1 and the second inorganic layer IOL2 may protect the display element layer DP-OLED from moisture and/or oxygen, and the organic layer OL may protect the display element layer DP-OLED from foreign substances, for example, such as dust particles. Each of the first inorganic layer IOL1 and the second inorganic layer IOL2 may include one or more of a silicon nitride layer, a silicon oxynitride layer, and a silicon oxide layer. In an exemplary embodiment of the present disclosure, the first inorganic layer IOL1 and the second inorganic layer IOL2 may include a titanium oxide layer or an aluminum oxide layer. The organic layer OL may include an acrylic-based organic layer, but the present disclosure is not limited thereto.

In an exemplary embodiment of the present disclosure, an inorganic layer (e.g., an LiF layer) may be further disposed between the capping layer CPL and the first inorganic layer IOL1. In this case, the inorganic layer (e.g., the LiF layer) may improve the light emission efficiency of the organic light emitting diode OLED.

Figure 6A:
FIG. 6A is a cross-sectional view illustrating an input sensing layer according to an exemplary embodiment of the present disclosure.
Figure 6B:
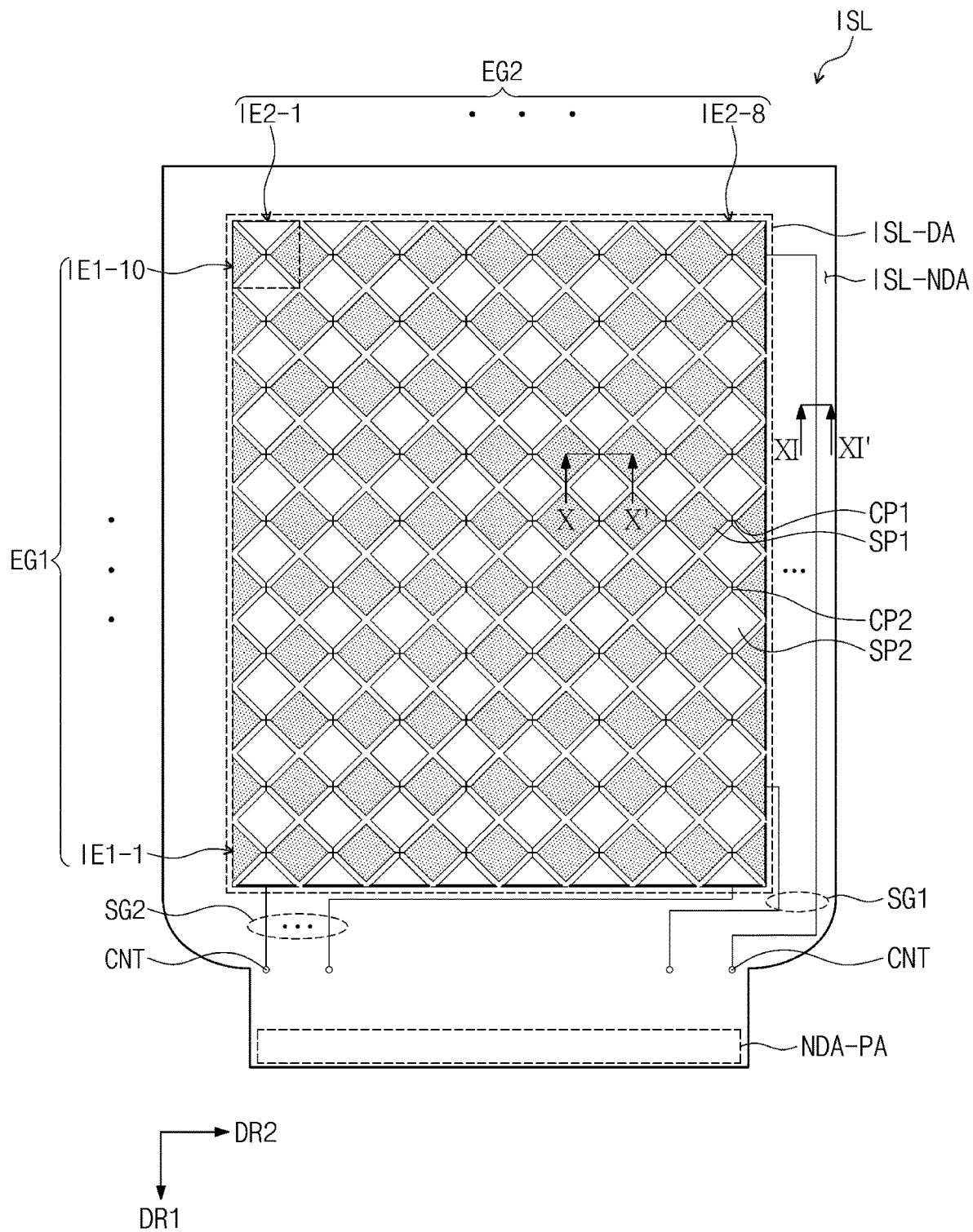
FIG. 6B is a plan view illustrating an input sensing layer according to an exemplary embodiment of the present disclosure.
Figure 6C:
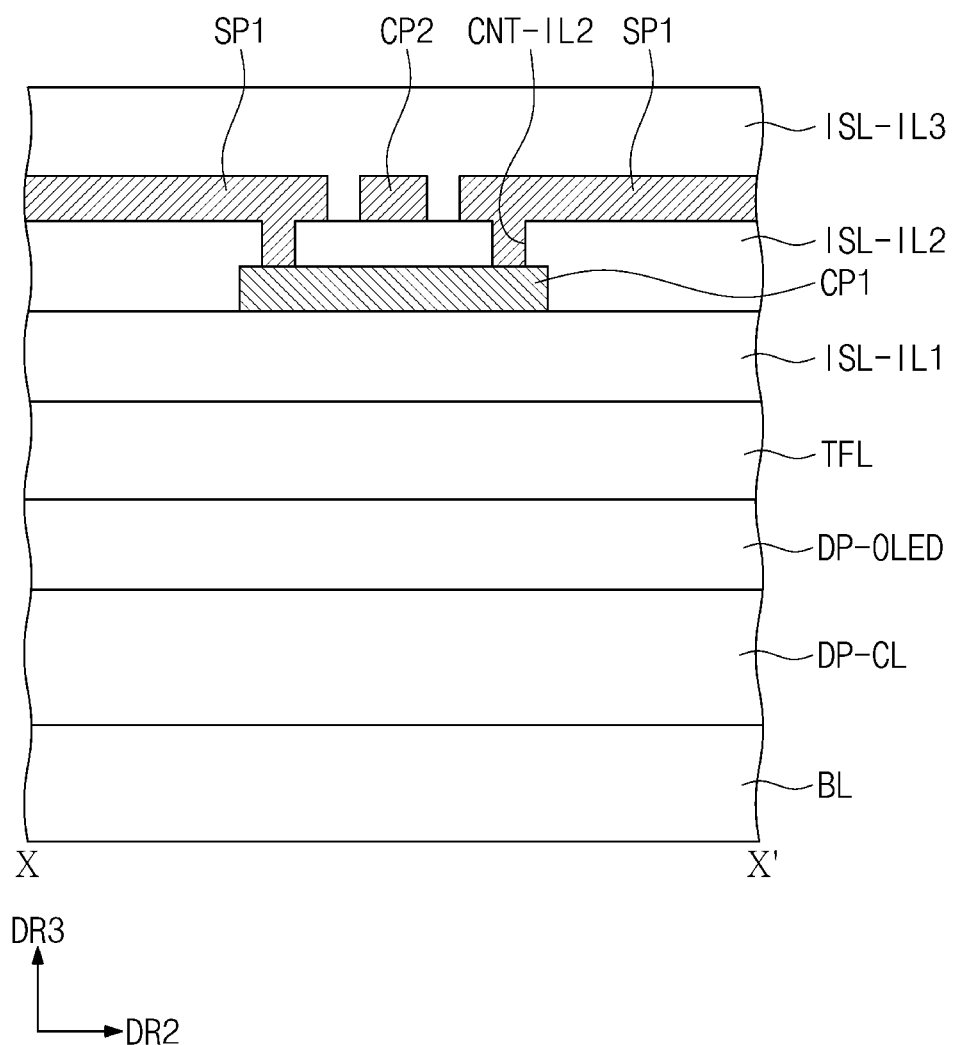
FIGS. 6C-6D are partial cross-sectional views illustrating an input sensing layer according to an exemplary embodiment of the present disclosure.
Figure 6D:
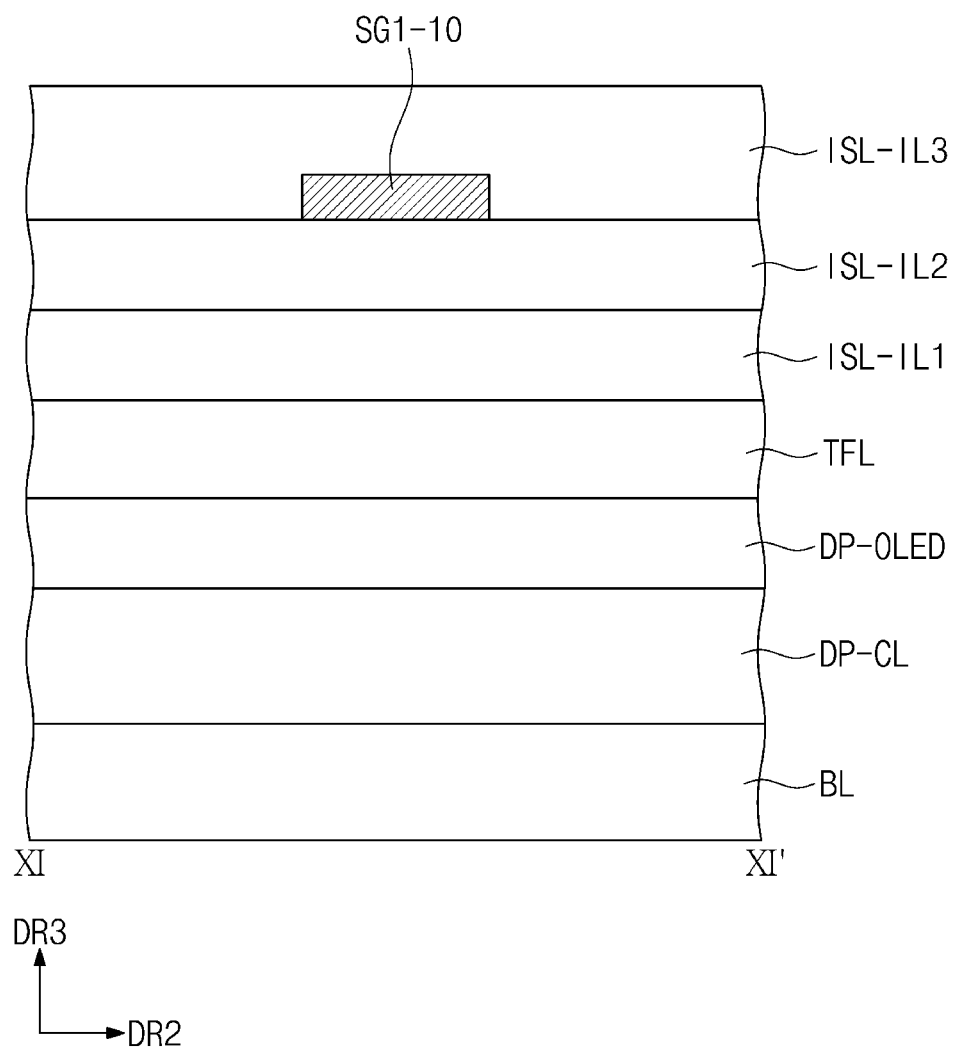

FIG. 6A is a cross-sectional view illustrating the input sensor ISL according to an exemplary embodiment of the present disclosure. FIG. 6B is a plan view illustrating the input sensor ISL according to an exemplary embodiment of the present disclosure. FIGS. 6C and 6D are partial cross-sectional views illustrating the input sensor ISL according to an exemplary embodiment of the present disclosure.

As illustrated in FIG. 6A, the input sensor ISL may include a first insulating layer ISL-IL1 (hereinafter, referred to as a "first input insulating layer"), a first conductive layer ISL-CL1, a second insulating layer ISL-IL2 (hereinafter, referred to as a "second input insulating layer"), a second conductive layer ISL-CL2, and a third insulating layer ISL-IL3 (hereinafter, referred to as a "third input insulating layer"). The first input insulating layer ISL-IL1 may be disposed (e.g., directly disposed) on the upper insulating layer TFL. However, the present disclosure is not limited thereto, and in another exemplary embodiment of the present disclosure, the first input insulating layer ISL-IL1 may be omitted.

Each of the first conductive layer ISL-CL1 and the second conductive layer ISL-CL2 may have a single-layer structure or a multi-layer structure in which layers are stacked on each other in the third direction DR3. A conductive layer having the multi-layer structure may include at least two or more layers from among transparent conductive layers and metal layers. The conductive layer having the multi-layer structure may include metal layers having different metals from each other. The transparent conductive layer may include, for example, indium tin oxide (ITO), indium zinc oxide (IZO), zinc oxide (ZnO), indium tin zinc oxide (ITZO), PEDOT, a metal nanowire, and/or a graphene. The metal layer may include, for example, molybdenum, silver, titanium, copper, aluminum, and/or alloys thereof. For example, each of the first conductive layer ISL-CL1 and the second conductive layer ISL-CL2 may have a three-layer structure of titanium/aluminum/titanium. A metal having a relatively high durability and a low reflectance may be an outer layer (e.g., or outer layers), and a metal having a relatively high electrical conductivity may be an inner layer (e.g. an intervening layer, a middle layer, or middle layers).

Each of the first conductive layer ISL-CL1 and the second conductive layer ISL-CL2 includes a plurality of conductive patterns. Hereinafter, the first conductive layer ISL-CL1 will be described as including first conductive patterns, and the second conductive layer ISL-CL2 will be described as including second conductive patterns. Each of the first conductive patterns and the second conductive patterns may include sensing electrodes and signal lines connected to the sensing electrodes.

Each of the first, second, and third input insulating layers, ISL-IL1, ISL-IL2, and ISL-IL3 may include an inorganic layer or an organic layer. For example, in an exemplary embodiment, the first input insulating layer ISL-IL1 and the second input insulating layer ISL-IL2 may include or be an inorganic layer. The inorganic layer may include at least one of, for example, aluminum oxide, titanium oxide, silicon oxide, silicon oxynitride, zirconium oxide, and hafnium oxide. The third input insulating layer ISL-IL3 may include or be an organic layer. The organic layer may include at least one of, for example, an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin.

As illustrated in FIG. 6B, the input sensor ISL includes a first electrode group EG1, a second electrode group EG2, and signal line groups connected to the first electrode group EG1 and the second electrode group EG2. In an exemplary embodiment, as shown in FIG. 6B, the input sensor ISL including two signal line groups SG1 and SG2 is illustrated as a representative example. The input sensor ISL may include a sensing area ISL-DA and a line area ISL-NDA, which correspond to the display area DP-DA and the non-display area DP-NDA, respectively, of the display panel DP. The sensing area ISL-DA may be defined as an area at (e.g., in or on) which the first electrode group EG1 and the second electrode group EG2 are disposed. The first signal line group SG1 and the second signal line group SG2 are disposed in the line area ISL-NDA.

In an exemplary embodiment, the input sensor ISL may include a capacitive type touch sensor, but the present disclosure is not limited thereto. One group from among the first electrode group EG1 and the second electrode group EG2 receives a driving signal, and the other group from among the first electrode group EG1 and the second electrode group EG2 outputs a sensing signal corresponding to a variation in capacitance between the first electrode group EG1 and the second electrode group EG2.

In an exemplary embodiment, a driving period may be divided into first and second driving periods. In this case, the input sensor ISL may be driven in the above-described manner during the first driving period, and the input sensor ISL may be driven in an opposite manner to the above-described manner during the second driving period. For example, during the first driving period, the one group from among the first electrode group EG1 and the second electrode group EG2 may receive the driving signal, and the other group from among the first electrode group EG1 and the second electrode group EG2 may output the sensing signal. During the second driving period, the other group from among the first electrode group EG1 and the second electrode group EG2 may receive the driving signal, and the one group from among the first electrode group EG1 and the second electrode group EG1 may output the sensing signal.

The first electrode group EG1 includes a plurality of first sensing electrodes IE1-1 through IE1-10. The first electrode group EG1 including ten first sensing electrodes IE1-1 through IE1-10 is illustrated as a representative example, but the present disclosure is not limited to the number of first sensing electrodes shown in FIG. 6B. The first sensing electrodes IE1-1 through IE1-10 have a shape that extend in the second direction DR2. The second electrode group EG2 includes a plurality of second sensing electrodes IE2-1 through IE2-8. The second electrode group EG2 including eight second sensing electrodes IE2-1 through IE2-8 is illustrated as a representative example, but the present disclosure is not limited to the number of second sensing electrodes shown in FIG. 6B. The second sensing electrodes IE2-1 through IE2-8 have a shape that extend in the first direction DR1. The second sensing electrodes IE2-1 through IE2-8 have a length greater than that of the first sensing electrodes IE1-1 to IE1-10.

The first signal line group SG1 may include the same or substantially the same number of signal lines as that of the first sensing electrodes IE1-1 to IE1-10. The signal lines of the first signal line group SG1 may be connected to at least one ends from among both ends of each of the first sensing electrodes IE1-1 to IE1-10. The second signal line group SG2 may include the same or substantially the same number of signal lines as that of the second sensing electrodes IE2-1 to IE2-8. The signal lines of the second signal line group SG2 may be connected to at least one ends from among both ends of each of the second sensing electrodes IE2-1 to IE2-8.

The signal lines of the first signal line group SG1 may be connected to some of the auxiliary lines SSL (e.g., refer to FIG. 4A) disposed at one side of the pad area NDA-PA via contact holes CNT. The signal lines of the second signal line group SG2 may be connected to some of the auxiliary lines SSL (e.g., refer to FIG. 4A) disposed at the other side of the pad area NDA-PA via contact holes CNT.

The contact holes CNT extend (e.g., penetrate) through insulating layers disposed between the signal lines of the first signal line group SG1 and the auxiliary lines SSL. For example, the contact holes CNT may extend (e.g., penetrate) through some of the first to sixth insulating layers 10 to 60 and the first and second input insulating layers ISL-IL1 and ISL-IL2 of the input sensor ISL.

Each of the first sensing electrodes IE1-1 to IE1-10 may include a plurality of sensor portions SP1 and a plurality of bridge portions CP1. The plurality of sensor portions SP1 may be connected by the plurality of bridge portions CP1. Each of the second sensing electrodes IE2-1 to IE2-8 may include a plurality of first portions SP2 and a plurality of second portions CP2. At least two of the plurality of first portions SP2 may be disposed with each of the plurality of second portions CP2 therebetween.

FIG. 6C illustrates a cross-sectional view taken along the line X-X' of FIG. 6B. FIG. 6C illustrates an example in which the bridge portion CP1 crosses the second portion CP2. In an exemplary embodiment, the bridge portion CP1 may correspond to a bridge pattern. However, the present disclosure is not limited thereto, and in another exemplary embodiment of the present disclosure, the second portion CP2 may correspond to a bridge pattern.

Referring to FIGS. 6A through 6C, the bridge portions CP1 are formed using the first conductive layer ISL-CL1, and the sensor portions SP1, the first portions SP2, and the second portions CP2 are formed using the second conductive layer ISL-CL2. The sensor portions SP1 may be connected to the bridge portions CP1 through contact holes CNT-IL2 extending (e.g., penetrating) through the second input insulating layer ISL-IL2.

In an exemplary embodiment, as shown in FIG. 6C, the bridge portions CP1 may cross the second portions CP2, but the present disclosure is not limited thereto. For example, each of the bridge portions CP1 may be modified to have a curved line form having a shape "Λ" corresponding to a V-like shape that is rotated by about 180 degrees and/or a curved line form having a V-like shape "v" so as not to overlap with the second portions CP2. The bridge portions CP1 having the curved line form of the shape "Λ" and/or the curved line form of the shape "v" may overlap with the first portions SP2 when viewed in a plan view.

According to an exemplary embodiment, the signal lines of the first signal line group SG1 and the second signal line group SG2 include at least one of a portion disposed on the same or substantially the same layer as that of the first sensing electrodes IE1-1 to IE1-10 and a portion disposed on the same or substantially the same layer as that of the second sensing electrodes IE1-1 to IE1-8.

FIG. 6D illustrates a cross-sectional view taken along the line XI-XI' of FIG. 6B. A tenth signal line SG1-10 from among the first signal line group SG1 is illustrated as a representative example. The first signal line group SG1 includes at least the portion disposed on the same or substantially the same layer as that of the second sensing electrodes IE1-1 to IE1-8. The signal lines of the first signal line group SG1 and the second signal line group SG2 may further include a portion formed using the first conductive layer ISL-CL1 (e.g., refer to FIG. 6A).

Figure 7A:
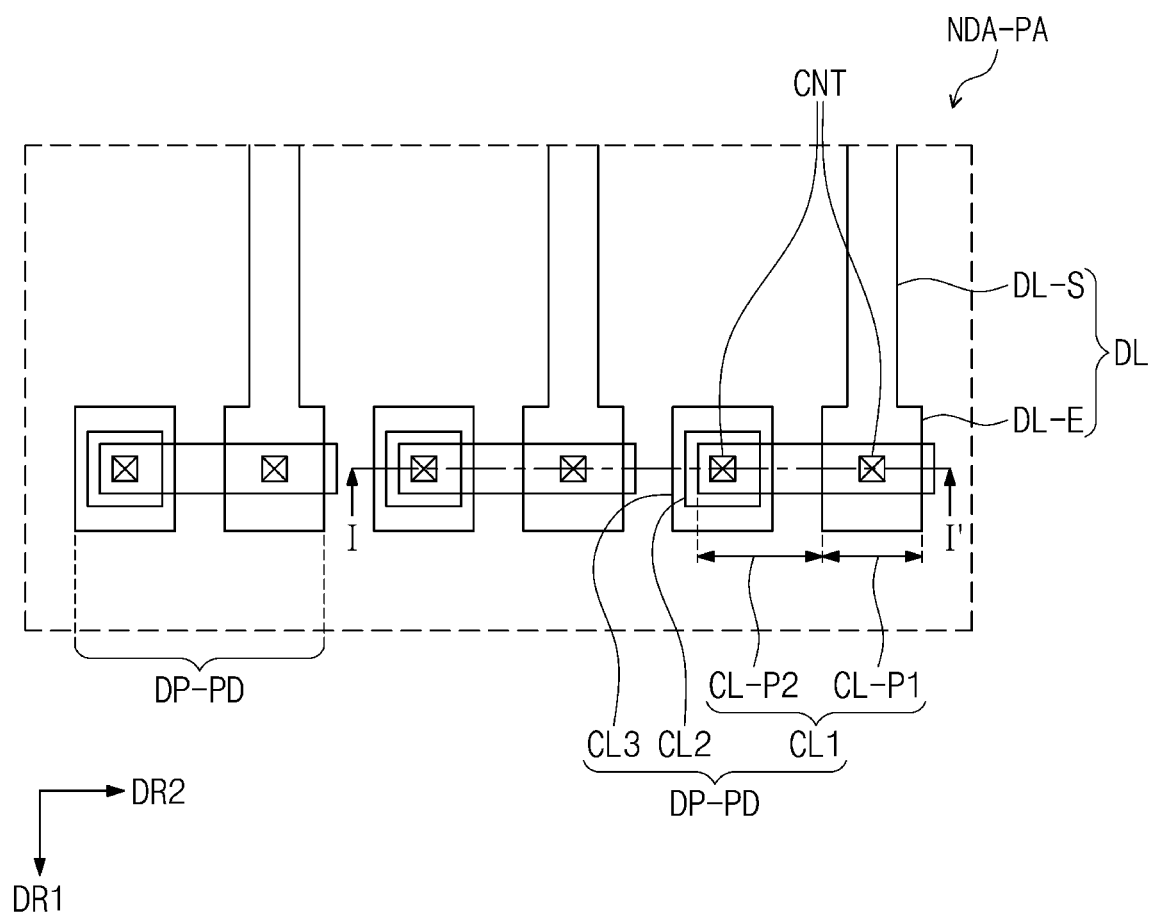
FIG. 7A is a partial plan view illustrating a pad area according to an exemplary embodiment of the present disclosure.
Figure 7B:
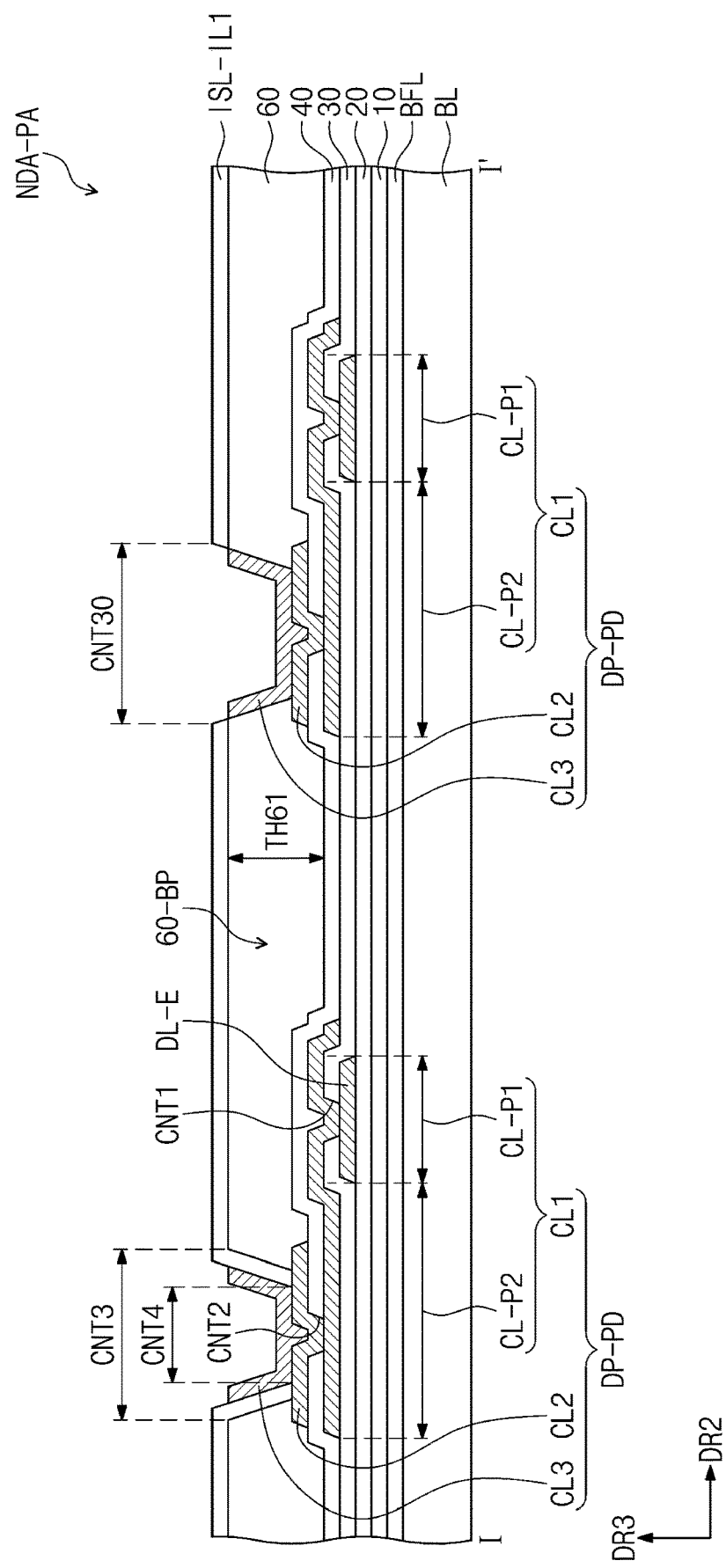
FIGS. 7B-7D are cross-sectional views taken along the line I-I' of FIG. 7A.
Figure 7C:
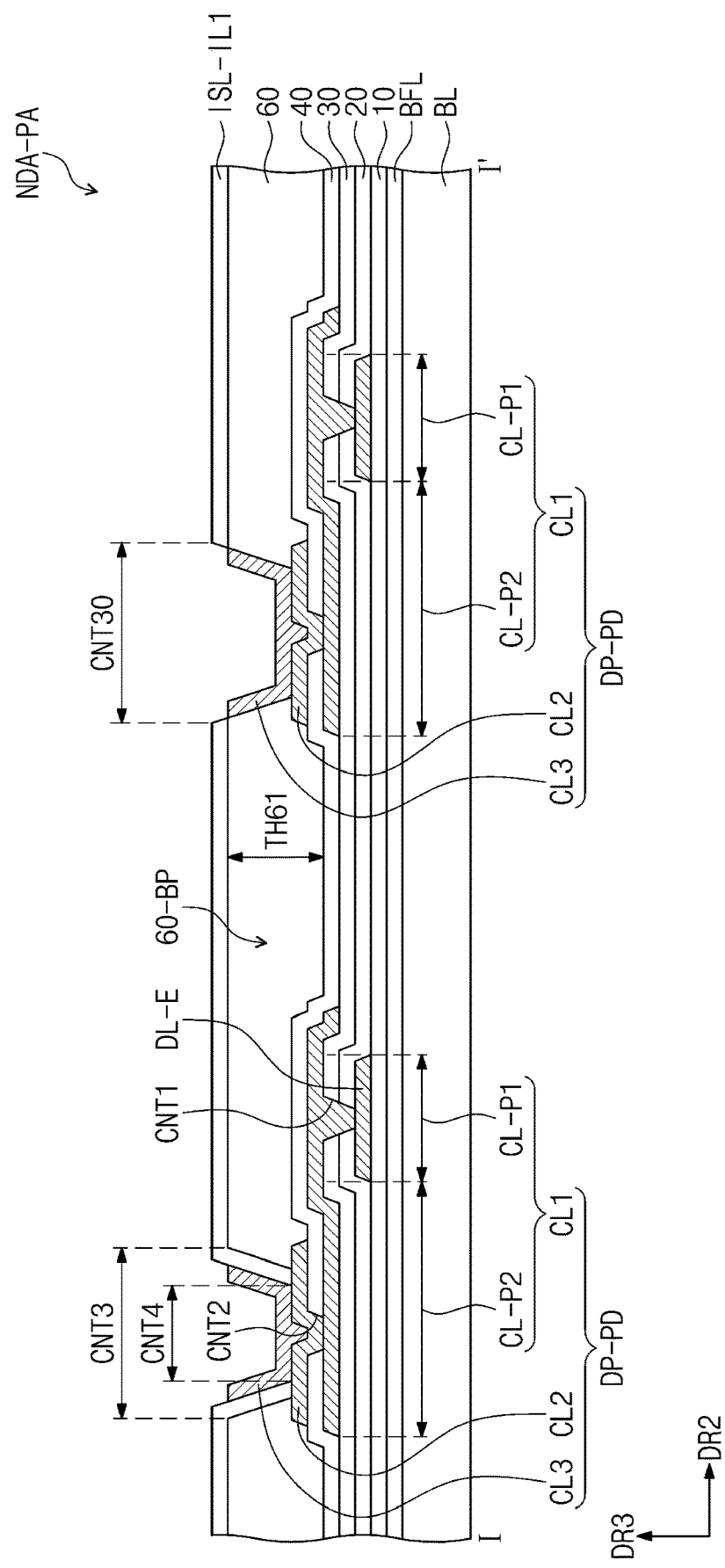
Figure 7D:
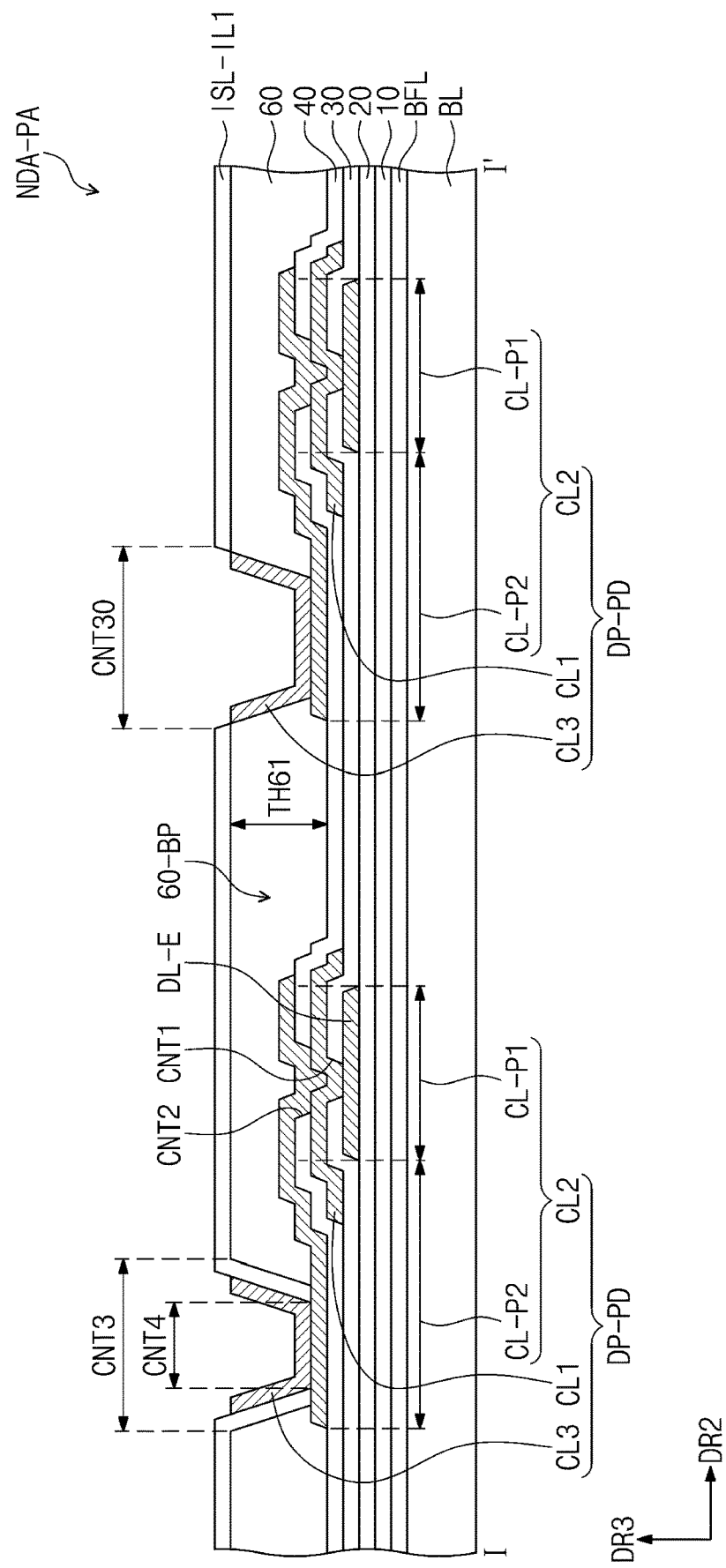

FIG. 7A is a partial plan view illustrating the pad area NDA-PA of the display panel DP according to an exemplary embodiment of the present disclosure. FIGS. 7B through 7D are cross-sectional views taken along the line I-I' of FIG. 7A. Hereinafter, redundant descriptions of the same or substantially the same components and/or configurations as those described with reference to FIGS. 1 through 6D may not be repeated.

FIGS. 7A through 7D illustrate the first signal pads DP-PD as a representative example, but the second signal pads ISL-PD may have the same or substantially the same structure and/or arrangement as those of the first signal pads DP-PD.

The first signal pads DP-PD may be arranged at intervals (e.g., regular intervals) along the second direction DR2. A portion of the signal line DL illustrated in FIG. 7A may correspond to a fourth portion P4 of the signal line DL illustrated in FIG. 4A. An end portion DL-E of the signal line DL may have a relatively greater width when compared with that of a line portion DL-S. The width may be defined as a length (e.g., the shortest length) in the second direction DR2. However, the present disclosure is not limited thereto, and in another exemplary embodiment of the present disclosure, the end portion DL-E may have the same or substantially the same width as that of the line portion DL-S without being distinguished from the line portion DL-S. In FIG. 7A, a contact hole CNT is illustrated as a representative example of a plurality of contact holes.

Referring to FIG. 7B, the end portion DL-E of the signal line DL is disposed on the second insulating layer 20. The end portion DL-E of the signal line DL is disposed on the same or substantially the same layer as that of the upper electrode UE illustrated in FIG. 5A. This structure is the same or substantially the same as the structure in which the fourth portion P4 of the signal line DL illustrated in FIG. 4A is disposed on the same or substantially the same layer as that of the upper electrode UE. A first portion P1 and a third portion P3 of the signal line DL illustrated in FIG. 4A may be disposed on the same or substantially the same layer as that of the second connection electrode CNE2 illustrated in FIG. 5A, and a second portion P2 of the signal line DL may be disposed on the same or substantially the same layer as that of the upper electrode UE.

A first conductive pattern CL1 is disposed on the third insulating layer 30, and overlaps with the end portion DL-E. The first conductive pattern CL1 is contacted (or electrically connected) to the end portion DL-E through a first contact hole CNT1 that extends (e.g., penetrates) through the third insulating layer 30.

The first conductive pattern CL1 includes a first portion CL-P1 that overlaps with the end portion DL-E, and a second portion CL-P2 that extends from the first portion CL-P1. The second portion CL-P2 is disposed between the end portion DL-E of a corresponding signal line DL and an end portion DL-E of another signal line DL that is adjacent to (e.g., closest to) the corresponding signal line DL.

In FIGS. 7A and 7B, the second portion CL-P2 is defined by a portion that extends to the left of the first portion CL-P1. In an exemplary embodiment, the first conductive pattern CL1 may further include a portion extending to the right of the first portion CL-P1, and not overlapping with the end portion DL-E. The portion extending to the right of the first portion CL-P1 may be defined as a third portion. However, the portion (e.g., the third portion) where a sufficient contact area is not secured by a contact hole may be omitted.

The second portion CL-P2 may be defined by a portion that does not overlap with the end portion DL-E of the corresponding signal line DL. The second portion CL-P2 of a signal pad DP-PD illustrated on the right side of FIG. 7B is disposed between the two end portions DL-E of two signal lines DL illustrated in FIG. 7B.

A second conductive pattern CL2 is disposed on the fourth insulating layer 40. The second conductive pattern CL2 is contacted to the second portion CL-P2 through a second contact hole CNT2 that extends (e.g., penetrates) through the fourth insulating layer 40. When viewed in a plan view (e.g., on a plane parallel or substantially parallel to a top surface of the display), the second contact hole CNT2 does not overlap with the end portion DL-E.

The sixth insulating layer 60 is disposed on the fourth insulating layer 40. Third contact holes CNT3 and CNT30 are defined through the sixth insulating layer 60 to expose the second conductive pattern CL2. FIG. 7B illustrates two kinds of third contact holes CNT3 and CNT30 as a representative example. The third contact hole CNT3 shown on the left side of FIG. 7B and the third contact hole CNT30 shown on the right side of FIG. 7B may be formed through different processes from each other. For example, a contact structure shown on the left side of FIG. 7B may be obtained by forming the first input insulating layer ISL-IL1 after forming the third contact hole CNT3. The contact structure shown on the right side of FIG. 7B may be obtained by forming the third contact hole CNT30 through the first input insulating layer ISL-IL1 and the sixth insulating layer 60 after forming the sixth insulating layer 60 and the first input insulating layer ISL-IL1.

In more detail, the contact structure shown on the left side of FIG. 7B may be obtained by depositing the first input insulating layer ISL-IL1 after forming the third contact hole CNT3, and by forming a fourth contact hole CNT4 through the first input insulating layer ISL-IL1 to expose the second conductive pattern CL2.

The third and fourth contact holes CNT3 and CNT4 shown on the left side of FIG. 7B, and the third contact hole CNT30 shown on the right side of FIG. 7B are illustrated for one pad area NDA-PA, but the present disclosure is not limited thereto. For example, in various exemplary embodiments, the contact structure in the pad area NDA-PA may be formed to have the same or substantially the same structure as that of either the contact structure shown on the left side of FIG. 7B, or the contact structure shown on the right side of FIG. 7B.

Referring to the cross-sectional view of the pad area NDA-PA illustrated in FIG. 7B and the cross-sectional view of the display area DP-DA illustrated in FIG. 5A, the stacking structures of the insulating layers are different from each other. For example, the fifth insulating layer 50 may not be disposed in the pad area NDA-PA. Accordingly, the second connection electrode CNE2 shown in FIG. 5A and the second conductive pattern CL2 shown in FIG. 7B may be disposed on different layers from each other, even though the second connection electrode CNE2 shown in FIG. 5A and the second conductive pattern CL2 shown in FIG. 7B may be formed through the same or substantially the same process.

In addition, referring to FIGS. 3 to 5A, the upper insulating layer TFL may not be formed in the pad area NDA-PA. From among the first input insulating layer ISL-IL1, the second input insulating layer ISL-IL2, and the third input insulating layer ISL-IL3 described with reference to FIG. 6A, the second input insulating layer ISL-IL2 and the third input insulating layer ISL-IL3 may not be formed in the pad area NDA-PA. In the pad area NDA-PA, the sixth insulating layer 60 may be directly disposed on the fourth insulating layer 40, and the first input insulating layer ISL-IL1 may be directly disposed on the sixth insulating layer 60.

In an exemplary embodiment, an insulating layer that is disposed on the second conductive pattern CL2 and that exposes the second conductive pattern CL2 may be defined as a pad insulating layer. The pad insulating layer may overlap with the display area DP-DA and the pad area NDA-PA. For example, as shown in FIG. 7B, in an exemplary embodiment, the pad insulating layer may include the sixth insulating layer 60 and the first input insulating layer ISL-IL1.

Each of the contact holes CNT3 and CNT4 shown on the left side of FIG. 7B and the contact hole CNT30 shown on the right side of FIG. 7B may be defined as pad contact holes. The third conductive pattern CL3 is contacted to the second conductive pattern CL2 through the pad contact holes CNT3, CNT4, and CNT30. The third conductive pattern CL3 may be formed using the second conductive layer ISL-CL2 illustrated in FIG. 6A. The third conductive pattern CL3 may have a multi-layer structure, for example, a three-layer structure of titanium/aluminum/titanium.

The third conductive pattern CL3 is disposed at (e.g., inside, within, or on) the pad contact holes CNT3, CNT4, and CNT30 when viewed in a plan view. The third conductive pattern CL3 is disposed at (e.g., inside, within, or on) the pad contact holes CNT3 and CNT30 in the third direction DR3. Referring to the contact holes CNT3 and CNT4 shown on the left side of FIG. 7B, the third conductive pattern CL3 is disposed at (e.g., inside, within, or on) at least one pad contact hole CNT3 among the two pad contact holes CNT3 and CNT4. The third conductive pattern CL3 is a pattern that contacts (e.g., directly contacts) the anisotropic conductive film ACF (e.g., refer to FIG. 4A), and in an exemplary embodiment shown in FIG. 7B, the third conductive pattern CL3 may be defined as an upper conductive pattern. A thickness TH61 of the sixth insulating layer 60 (e.g., refer to FIG. 7B) in the pad area NDA-PA may be different from a thickness TH60 of the sixth insulating layer 60 (e.g., refer to FIG. 5A) in the display area DP-DA. The thickness of the sixth insulating layer 60, which may be an organic layer, may be controlled according to an area using a halftone mask.

The thickness TH61 of the sixth insulating layer 60 in the pad area NDA-PA may be less than the thickness TH60 of the sixth insulating layer 60 in the display area DP-DA. The thickness TH61 of the sixth insulating layer 60 in the pad area NDA-PA may be, for example, in a range from about 45% to about 55% of the thickness TH60 of the sixth insulating layer 60 in the display area DP-DA. The thickness TH61 is obtained by measuring a thickness of an area 60-BP (hereinafter, referred to as a "barrier area") disposed between two end portions DL-E at (e.g., in or on) the pad area NDA-PA, and the thickness TH60 is obtained by measuring a thickness of the sixth insulating layer 60 at an area overlapping with the transistor T2 in the display area DP-DA.

When the thickness TH61 of the sixth insulating layer 60 in the pad area NDA-PA is small, bonding characteristics of the third conductive pattern CL3 and the anisotropic conductive film ACF (e.g., refer to FIG. 4A) may be improved. The third conductive pattern CL3 is located lower than an upper surface of the sixth insulating layer 60 and an upper surface of the first input insulating layer ISL-IL1. A portion of the pad insulating layer, which overlaps with the end portions DL-E of the signal line DL, acts as a barrier to prevent or substantially prevent the third conductive patterns CL3 from shorting with each other.

For example, the first conductive layer ISL-CL1 may be formed on a surface (e.g., an entire surface) of the first input insulating layer ISL-IL1, and the first conductive layer ISL-CL1 may be patterned through an etching process to form the bridge portion CP1 (e.g., refer to FIG. 6C) from the first conductive layer ISL-CL1. A residue may remain on the first input insulating layer ISL-IL1 during the etching process for the first conductive layer ISL-CL1 at (e.g., in or on) the pad area NDA-PA. The barrier area 60-BP may serve as a barrier to prevent or substantially prevent the etching residue from shorting the third conductive patterns CL3 of the signal pads DP-PD adjacent thereto.

As illustrated in FIG. 7C, in an exemplary embodiment of the present invention, the end portion DL-E of the signal line DL may be disposed on the same or substantially the same layer as that of the gate G2 illustrated in FIG. 5A. The first contact hole CNT1 extends (e.g., penetrates) through the second insulating layer 20 and the third insulating layer 30. The gate G2 and the end portion DL-E of the signal line DL may be formed through the same or substantially the same process.

As illustrated in FIG. 7D, in an exemplary embodiment of the present invention, the second conductive pattern CL2 may include a first portion CL-P1 overlapping with the end portion DL-E, and a second portion CL-P2 extending from the first portion CL-P1. The second contact hole CNT2 may overlap with the first contact hole CNT1 when viewed in a plan view. The first portion CL-P1 of the second conductive pattern CL2 is contacted to the first conductive pattern CL1 through the second contact hole CNT2.

The second portion CL-P2 of the second conductive pattern CL2 is exposed through the third contact holes CNT3 and CNT30, and the third conductive pattern CL3 is contacted to the second portion CL-P2 of the second conductive pattern CL2.

In this case, the first conductive pattern CL1 may have a length that is less than that of the second conductive pattern CL2 in the second direction DR2. When viewed in a plan view (e.g., on a plane parallel or substantially parallel to a top surface of the display), the first conductive pattern CL1 may not overlap with the third contact holes CNT3 and CNT30. The first conductive pattern CL1 may further include a portion corresponding to (e.g., overlapping with) the second portion CL-P2 of the second conductive pattern CL2.

Figure 8A:
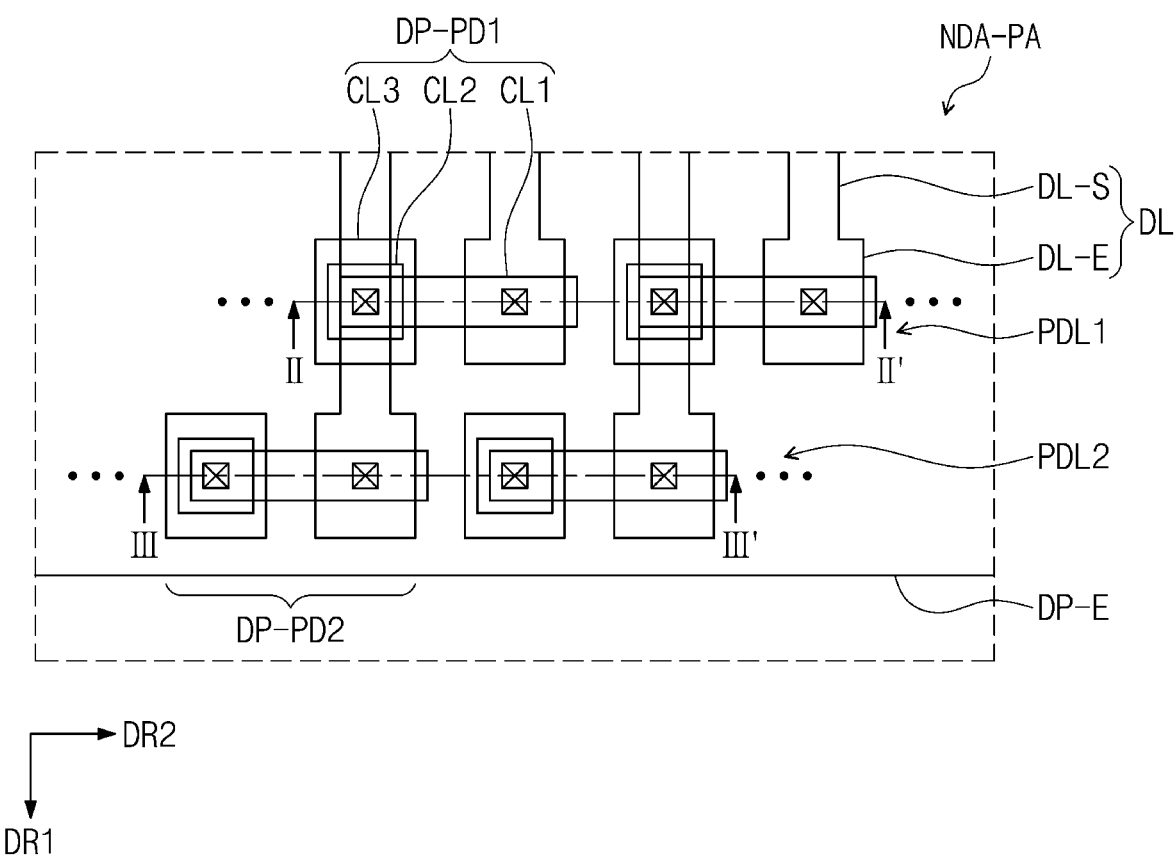
FIG. 8A is a partial plan view illustrating a pad area according to an exemplary embodiment of the present disclosure.
Figure 8B:
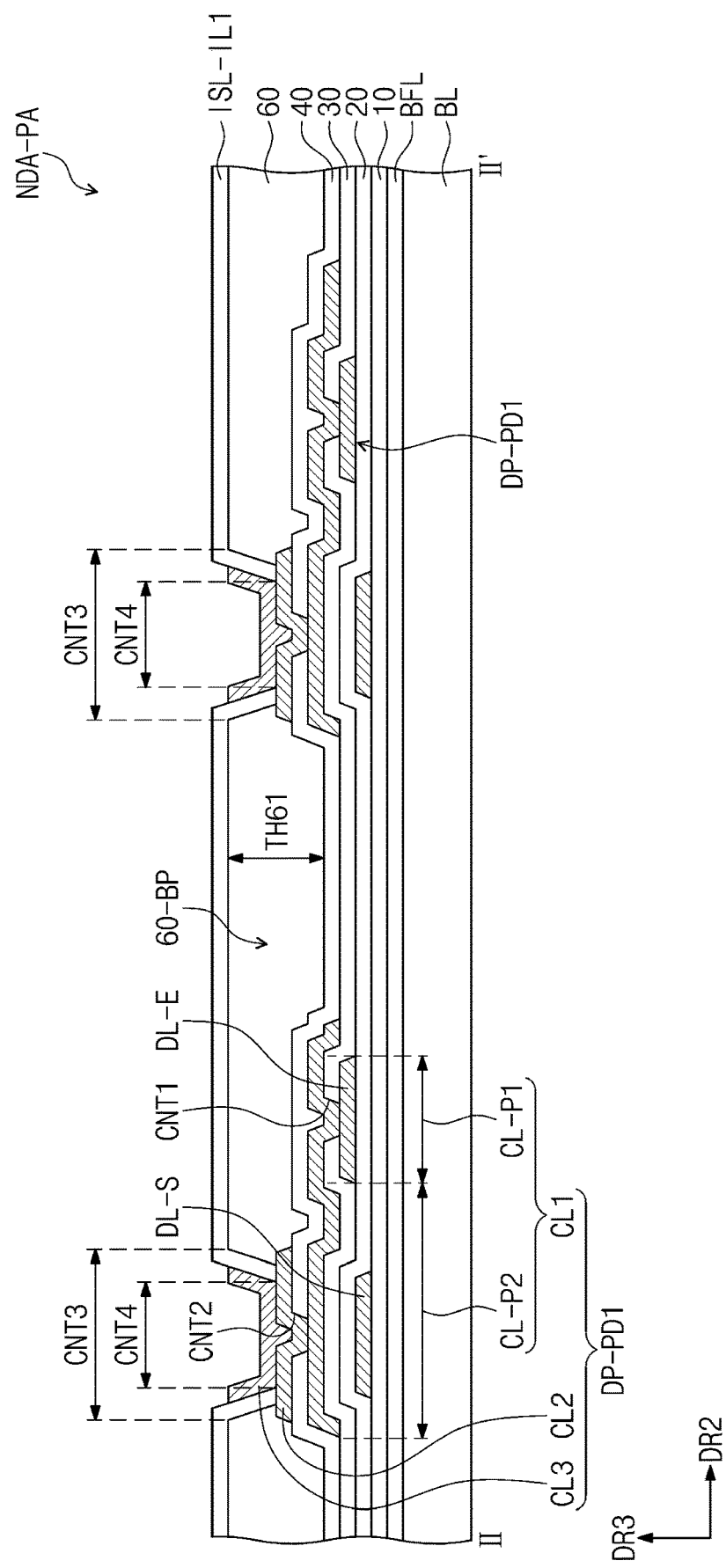
FIG. 8B is a cross-sectional view taken along the line II-II' of FIG. 8A.
Figure 8C:
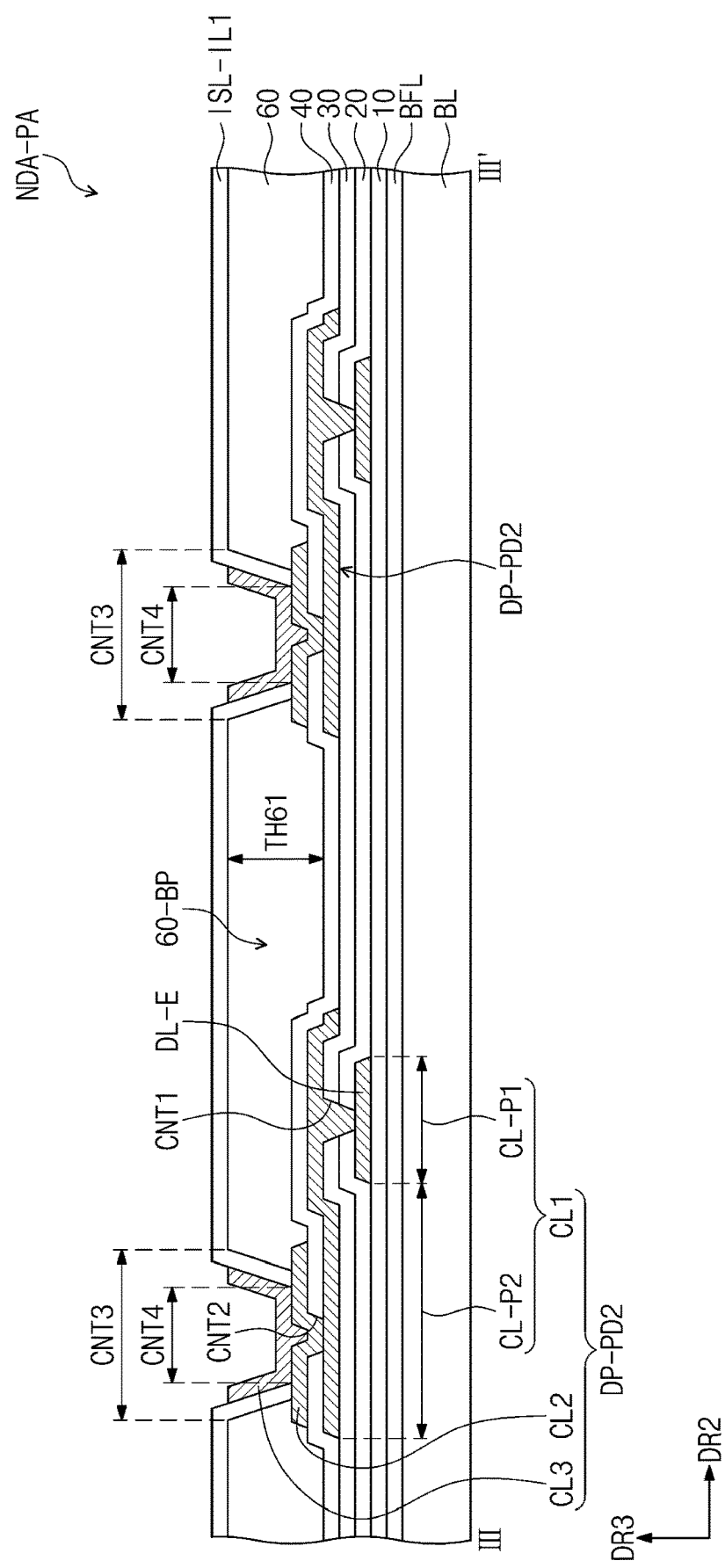
FIG. 8C is a cross-sectional view taken along the line III-III' of FIG. 8A.

FIG. 8A is a partial plan view illustrating the pad area NDA-PA according to an exemplary embodiment of the present disclosure. FIG. 8B is a cross-sectional view taken along the line II-II' of FIG. 8A. FIG. 8C is a cross-sectional view taken along the line III-III' of FIG. 8A. Hereinafter, redundant descriptions of the same or substantially the same components and/or configurations as those described with reference to FIGS. 1 to 7D may not be repeated.

The signal pads DP-PD may be arranged in a plurality of rows, for example, a first pad row PDL1 and a second pad row PDL2, which are different from each other. The second pad row PDL2 is disposed adjacent to an edge DP-E of the display panel in the first direction DR1, such that the second pad row PDL2 is closer to the edge DP-E than the first pad row PDL1 in the first direction DR1. The signal pads of the first pad row PDL1 may be referred to as first signal pads DP-PD1, and the signal pads of the second pad row PDL2 may be referred to as second signal pads DP-PD2.

The second signal pads DP-PD2 are disposed in a staggered arrangement with respect to the first signal pads DP-PD1. The third conductive pattern CL3 of the first pad row PDL1 is aligned with the end portion DL-E of the signal line connected to the second pad row PDL2 in the first direction DR1. The third conductive pattern CL3 is disposed diagonally (e.g., on a diagonal line) with respect to the third conductive pattern CL3 of the second pad row PDL2.

FIG. 8B illustrates a cross-sectional view of a structure of the first signal pads DP-PD1. The structure of the first signal pads DP-PD1 shown in FIG. 8B may be the same or substantially the same as the cross-sectional view of the structure of the signal pads DP-PD illustrated in FIG. 7B as a representative example. Referring to FIG. 8B, the contact hole CNT3 shown at the left side of FIG. 8B and the contact hole CNT3 shown at the right side of FIG. 8B are the same or substantially the same as each other.

The line portion DL-S of the signal line DL connected to the second signal pads DP-PD2 overlaps with the third conductive pattern CL3 of the first pad row PDL1. The signal line DL connected to the second signal pads DP-PD2 is disposed on the same or substantially the same layer as that of the gate G2 illustrated in FIG. 5A.

FIG. 8C illustrates a cross-sectional view of a structure of the second signal pads DP-PD2. The structure of the second signal pads DP-PD2 may be the same or substantially the same as the cross-sectional view of the structure of the signal pad DP-PD shown on the left side of FIG. 7C as a representative example. However, the present disclosure is not limited thereto. For example, in various exemplary embodiments of the present disclosure, the cross-sectional structure of the first signal pads DP-PD1 and the second signal pads DP-PD2 illustrated in FIGS. 8B and 8C may be modified to have the same or substantially the same structure as that of the signal pad DP-PD shown on the left side of FIG. 7D or as that of the signal pad DP-PD shown on the right side of FIG. 7D. In other words, in another exemplary embodiment, the second conductive pattern CL2 may include the first portion CL-P1 and the second portion CL-P2.

Figure 9:
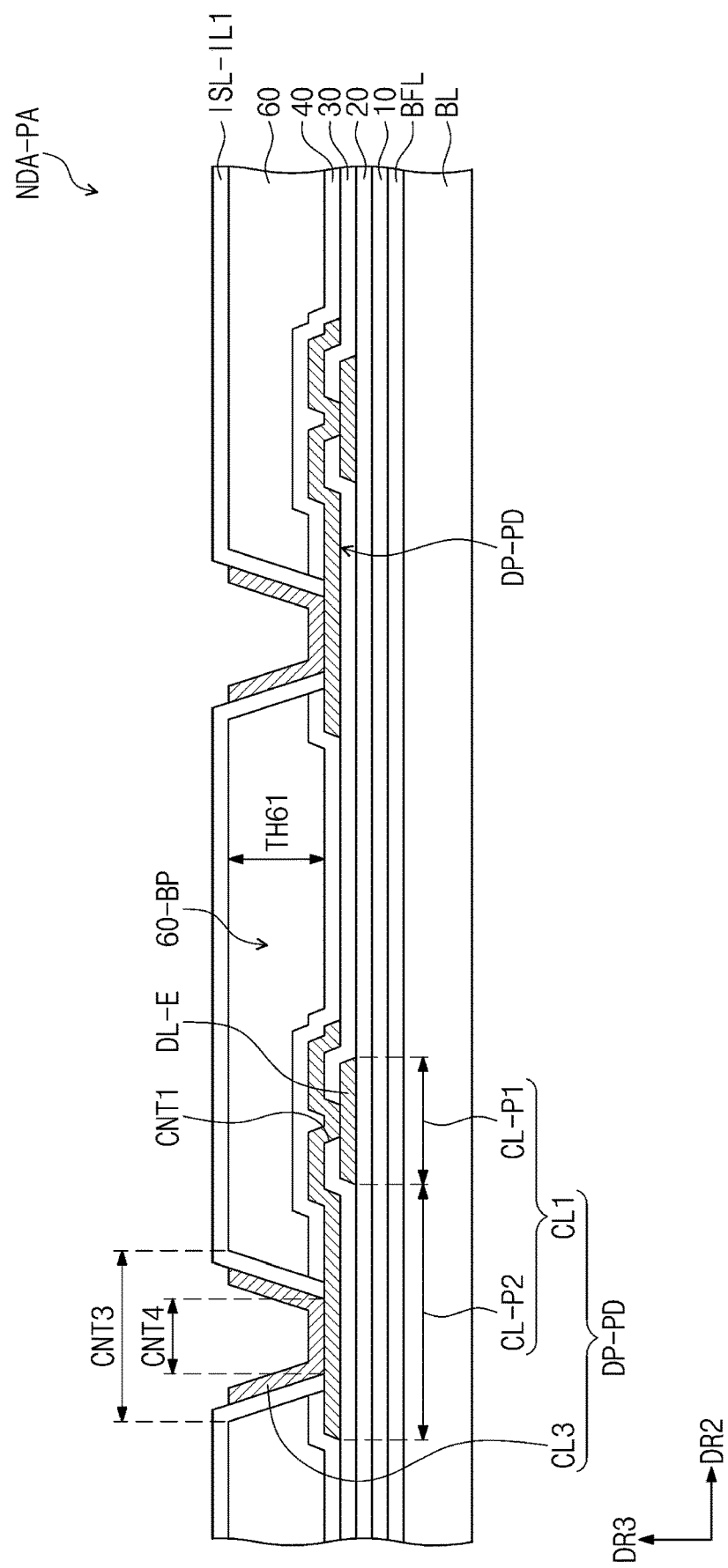
FIG. 9 is a cross-sectional view illustrating a pad area according to an exemplary embodiment of the present disclosure.

FIG. 9 is a partial plan view illustrating the pad area NDA-PA according to an exemplary embodiment of the present disclosure. Hereinafter, redundant descriptions of the same or substantially the same components and/or configurations as those described with reference to FIGS. 1 to 8C may not be repeated.

Referring to FIG. 9, the second conductive pattern CL2 is omitted when compared to the signal pad DP-PD shown in FIG. 7B. A stacked structure of the insulating layers 10 through 40 is illustrated as having the same or substantially the same stacked structure as that of the insulating layers 10 through 40 shown in FIG. 7B. However, the present disclosure is not limited thereto, and one or more of the insulating layers 10 through 40 may be omitted, for example, the fourth insulating layer 40 may be omitted in another exemplary embodiment of the present disclosure.

In more detail, the signal pads DP-PD connected to the first and second signal lines DL, respectively, may have the same or substantially the same stacked structure. In this case, the signal pads DP-PD include an intermediate conductive pattern CL1, and an upper conductive pattern CL3. The intermediate conductive pattern CL1 includes a first portion CL-P1 overlapping with the end portion DL-E of the signal line, and a second portion CL-P2 extending from the first portion CL-P1. The second portion CL-P2 of the intermediate conductive pattern CL1 may be disposed between the end portions DL-E of the two signal lines DL when viewed in a plan view. According to an exemplary embodiment, as shown in FIG. 9, the intermediate conductive pattern CL1 includes a conductive pattern having a single-layer structure, which is formed using one conductive layer. However, the present disclosure is not limited thereto, for example, according to the embodiment described with reference to FIG. 7B, the intermediate conductive pattern CL1 may include conductive patterns having a multi-layer structure, which may be formed using two or more conductive layers.

The first portion CL-P1 of the intermediate conductive pattern CL1 may be connected (e.g., directly connected) to the end portion DL-E of the signal line, or may be connected to the end portion DL-E through one or more other conductive patterns. The upper conductive pattern CL3 does not overlap with the end portions DL-E of the first and second signal lines DL.

Figure 10A:
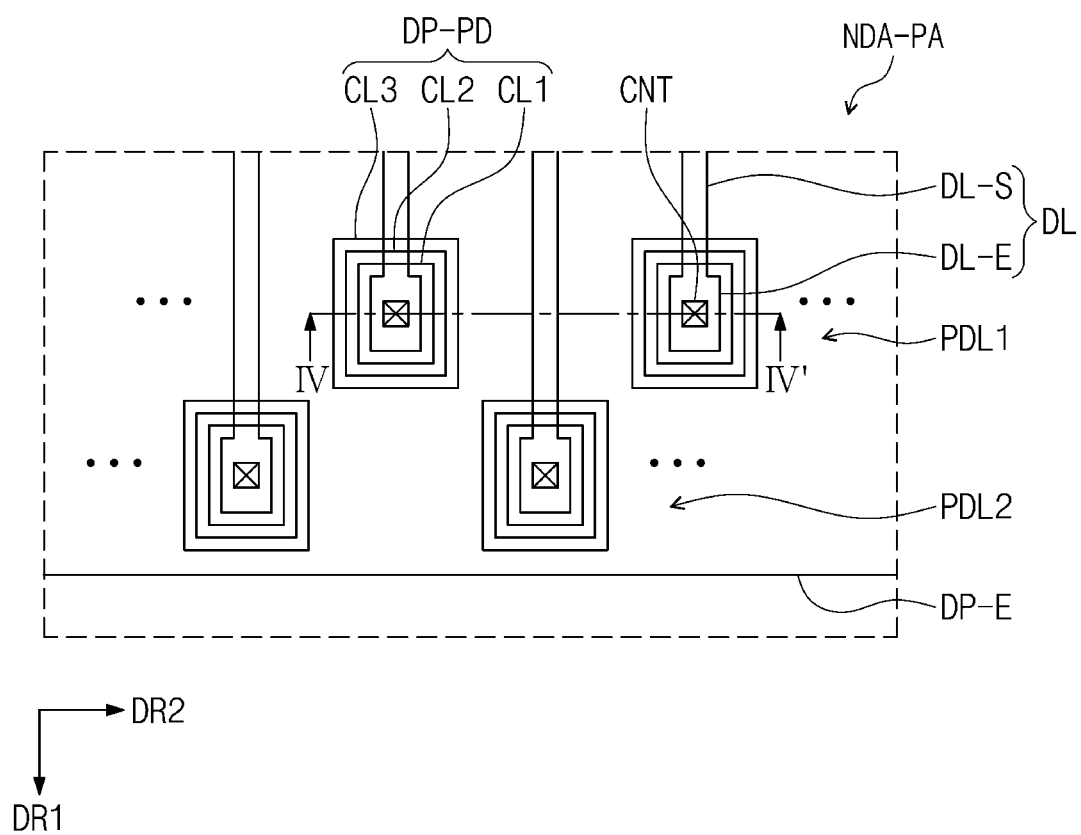
FIG. 10A is a partial plan view illustrating a pad area according to an exemplary embodiment of the present disclosure.

FIG. 10A is a partial plan view illustrating a pad area NDA-PA according to an exemplary embodiment of the present disclosure. FIGS. 10B through 10E are cross-sectional views taken along the line IV-IV' of FIG. 10A. Hereinafter, redundant descriptions of the same or substantially the same components and/or configurations as those described with reference to FIGS. 1 to 9 may not be repeated.

FIG. 10A illustrates the pad area NDA-PA that includes a first pad row PDL1 and a second pad row PDL2. According to an exemplary embodiment, the signal pads DP-PD may not include a conductive pattern that extends in the second direction DR2, which may be different from the signal pads DP-PD described with reference to one or more of the exemplary embodiments above.

Figure 10B:
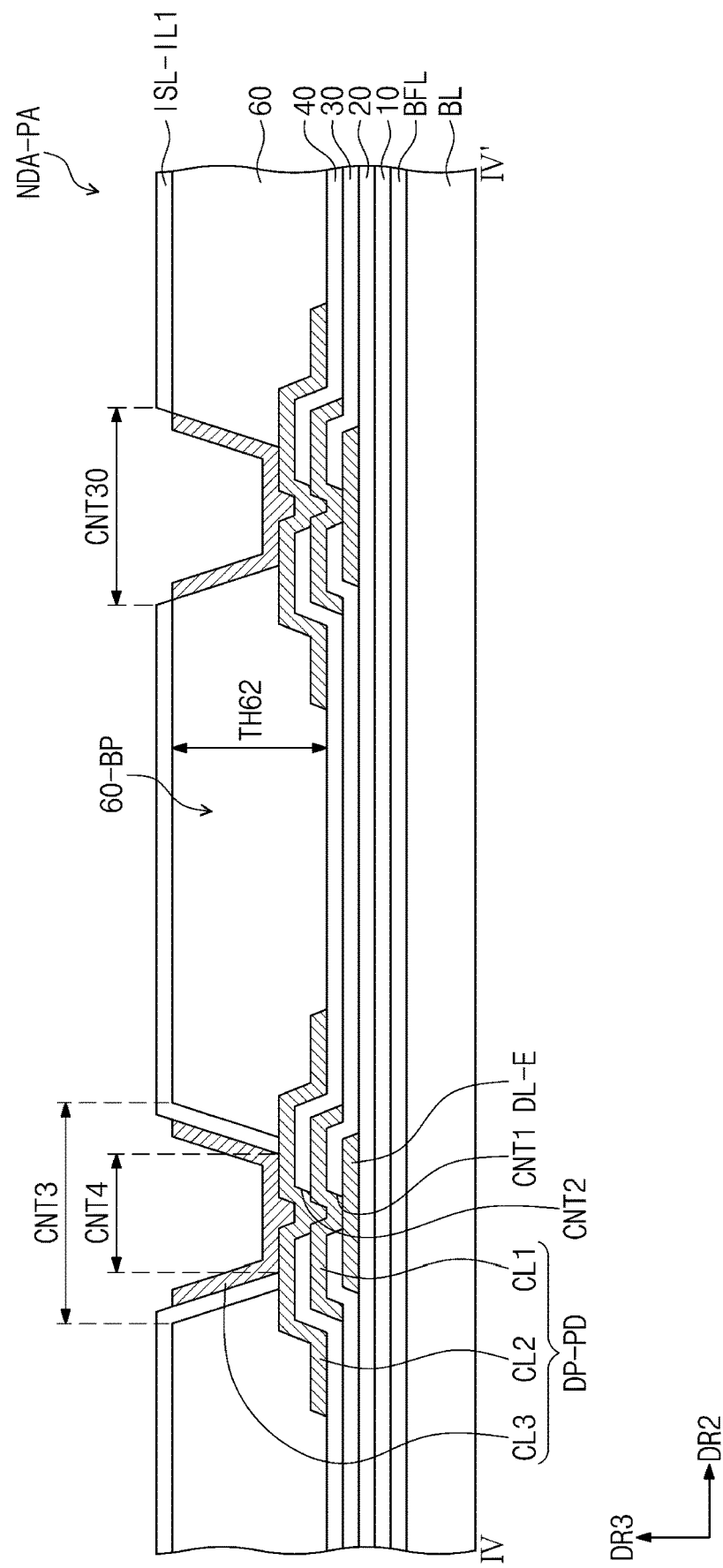
FIGS. 10B-10E are cross-sectional views taken along the line IV-IV' of FIG. 10A.
Figure 10C:
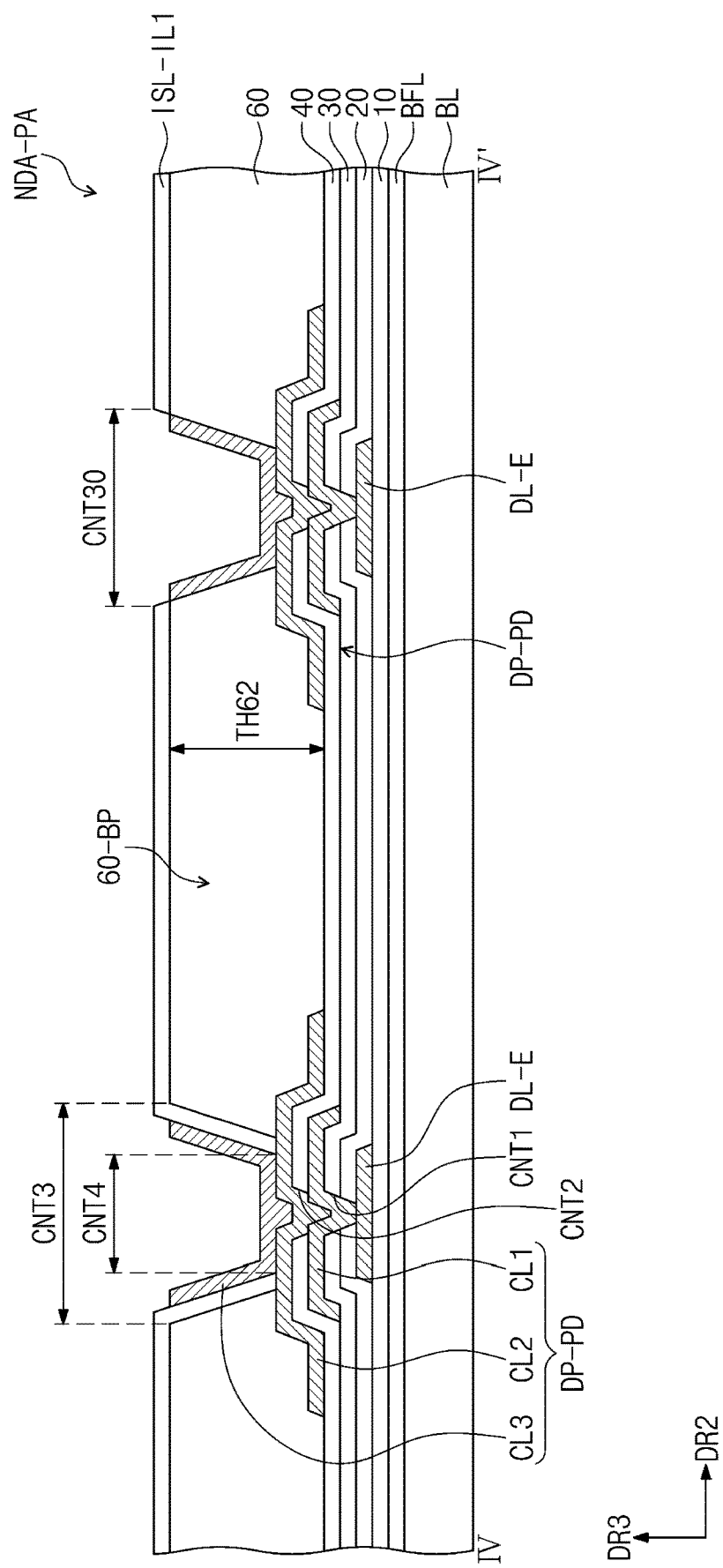

FIGS. 10B and 10C illustrate cross-sectional views corresponding to FIGS. 7B and 7C, respectively, according to other exemplary embodiments. The signal pad DP-PD includes a first conductive pattern CL1, a second conductive pattern CL2, and a third conductive pattern CL3. A second contact hole CNT2 overlaps with a first contact hole CNT1. The second contact hole CNT2 and the first contact hole CNT1 overlap with the end portion DL-E, the first conductive pattern CL1, the second conductive pattern CL2, and the third conductive pattern CL3. In an exemplary embodiment, an intermediate conductive pattern may have a two-layer structure, but the present disclosure is not limited thereto. In an exemplary embodiment of the present disclosure, the intermediate conductive pattern may include one of either the first conductive pattern CL1 or the second conductive pattern CL2.

A thickness TH62 of a barrier area 60-BP in the pad area NDA-PA may be less than the thickness TH60 of the sixth insulating layer 60 in the display area DP-DA illustrated in FIG. 5A. The thickness TH62 of the barrier area 60-BP may be in a range from about 60% to about 80% of the thickness TH60 of the sixth insulating layer 60 in the display area DP-DA. The thickness TH62 of the barrier area 60-BP may be adjusted by controlling an amount of light irradiated onto the barrier area 60-BP during an exposure process.

In an exemplary embodiment, the thickness TH62 of the barrier area 60-BP is relatively greater than the thickness TH61 of the barrier area 60-BP illustrated in FIG. 7B. In an exemplary embodiment, because the end portion DL-E, the first conductive pattern CL1, the second conductive pattern CL2, and the third conductive pattern CL3 are stacked to overlap with each other, an uppermost position of the third conductive pattern CL3 is relatively higher than an uppermost position of the third conductive pattern CL3 illustrated in FIG. 7B. Therefore, in an exemplary embodiment, when the thickness of the barrier area 60-BP is greater than the thickness of the barrier area 60-BP illustrated in FIG. 7B, the barrier area 60-BP illustrated in FIG. 10B may have the above-described function of a barrier (e.g., the barrier area 60-BP may serve as a barrier to prevent or substantially prevent etching residue from shorting the third conductive patterns CL3 with each other).

Figure 10D:
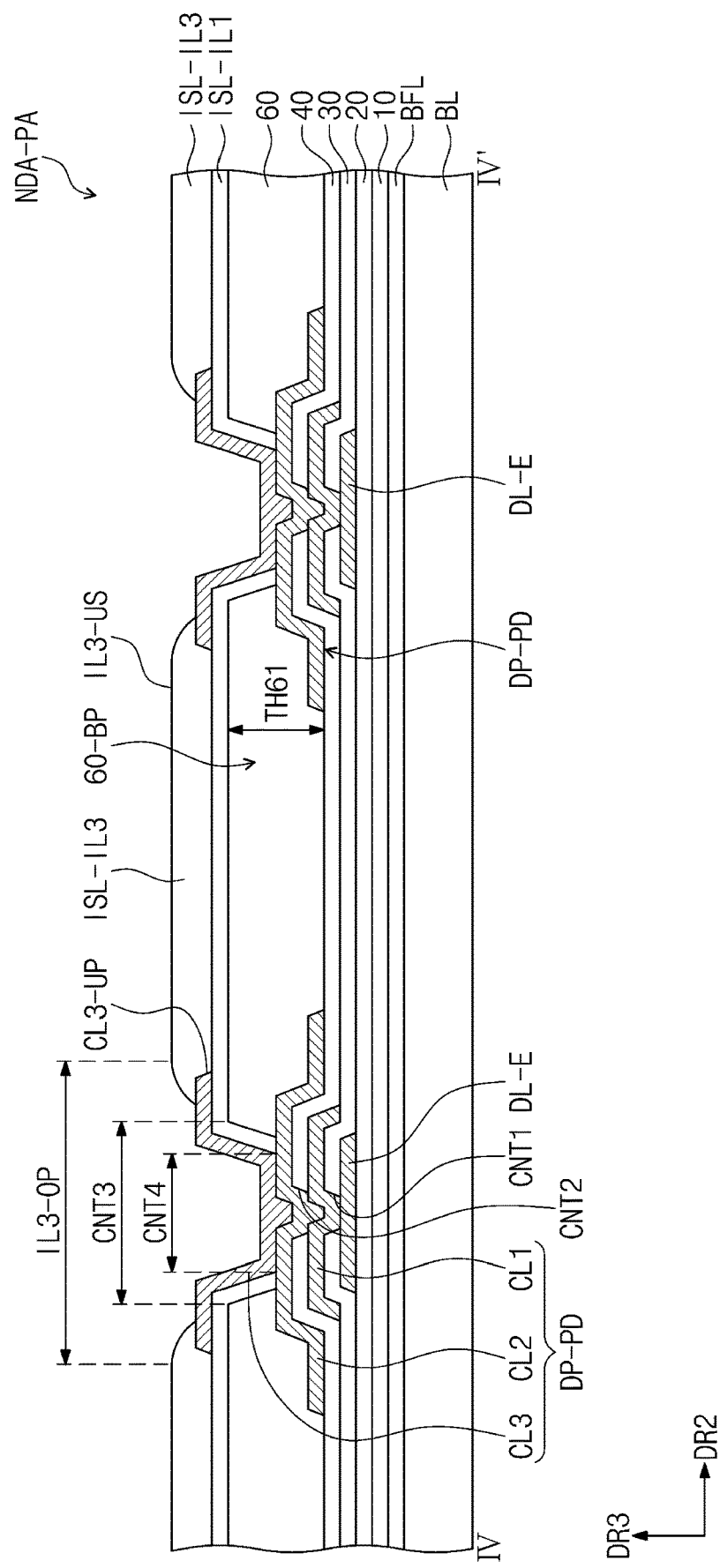

FIG. 10D illustrates a cross-sectional view corresponding to that illustrated in FIG. 7B, according to another exemplary embodiment. In an exemplary embodiment, a thickness TH61 of a barrier area 60-BP may be in a range from about 45% to about 55% of the thickness TH60 of the sixth insulating layer 60 in the display area DP-DA (e.g., see FIG. 5A). According to an exemplary embodiment, a pad insulating layer may further include a third input insulating layer ISL-IL3. The third input insulating layer ISL-IL3 includes an opening IL3-OP defined therethrough to expose the third conductive pattern CL3. In an exemplary embodiment of the present disclosure, the pad insulating layer may further include a first input insulating layer ISL-IL1. In this case, a contact hole is defined through the first input insulating layer ISL-IL1 to expose the second conductive pattern CL2.

The third input insulating layer ISL-IL3 may be an organic layer. An area disposed between two end portions DL-E of the third input insulating layer ISL-IL3 may serve as a barrier. An upper surface IL3-US of a portion of the third input insulating layer ISL-IL3 that is disposed between two signal pads DP-PD is disposed higher than an uppermost end CL3-UP of the upper conductive pattern CL3.

Figure 10E:
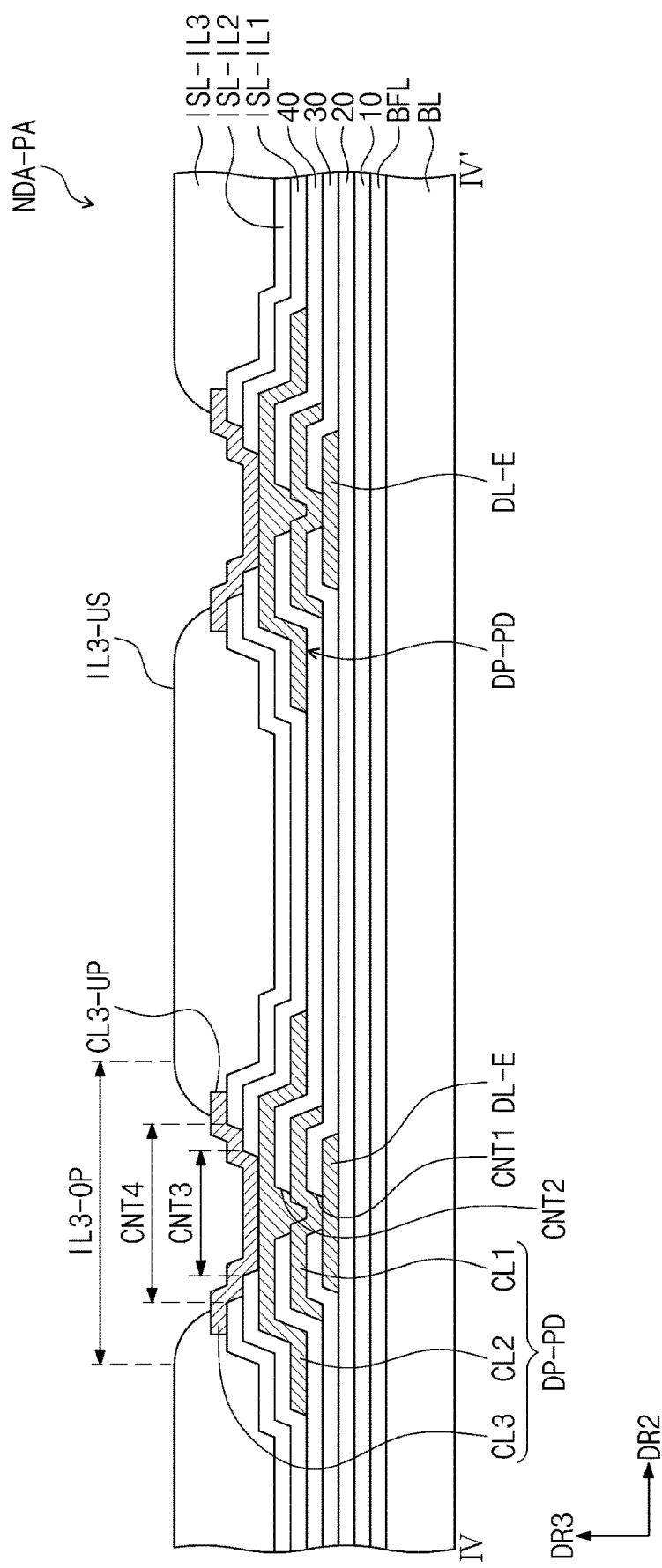

FIG. 10E illustrates a cross-sectional view of a pad area NDA-PA according to an exemplary embodiment. The exemplary embodiment illustrated in FIG. 10E may be different from that illustrated in FIG. 10D. According to an exemplary embodiment, as shown in FIG. 10E, a pad insulating layer may not include the sixth insulating layer 60. In this case, the pad insulating layer may include first, second, and third input insulating layers ISL-IL1, ISL-IL2, and ISL-IL3. The first and second input insulating layers ISL-IL1 and ISL-IL2 may include an inorganic layer, and the third input insulating layer ISL-IL3 may include an organic layer.

An area of the third input insulating layer ISL-IL3 disposed between two end portions DL-E may serve as a barrier. An upper surface IL3-US of a portion of the third input insulating layer ISL-IL3 that is disposed between two signal pads DP-PD is disposed higher than an uppermost end CL3-UP of the upper conductive pattern CL3.

Referring to FIGS. 10A to 10E, the third conductive patterns CL3 may be prevented or substantially prevented from shorting with each other by modifying (e.g., adjusting) a thickness of the pad insulating layer disposed between the end portions DL-E of the signal line. A portion of the pad insulating layer may serve (or function) as a barrier. In addition, the barrier is formed by controlling the stacked structure of the pad insulating layer and/or adjusting the thickness of the organic layer that is formed (e.g., concurrently or simultaneously formed) with the input sensor ISL.

While one or more exemplary embodiments of the present disclosure are described with reference to the drawings, it should be understood that embodiments described herein should be considered in a descriptive sense only and not for purposes of limitation. Accordingly, those with ordinary skill in the art of which the present invention pertains will understand that various aspect and features of the present invention may be modified without departing from the spirit and scope of the present invention as defined in the following claims, and their equivalents.

What is claimed is:
1. A display device comprising:
a base layer;
a plurality of electronic elements on the base layer;
a plurality of signal lines electrically connected to the electronic elements;
a plurality of signal pads, each of the plurality of signal pads being connected to a corresponding signal line from among the plurality of signal lines; and
a pad insulating layer,
wherein each of the plurality of signal pads comprises:
 a first conductive pattern overlapping with an end portion of the corresponding signal line and contacted to the end portion of the corresponding signal line;
 a second conductive pattern on the first conductive pattern, the second conductive pattern overlapping with the first conductive pattern and contacted to the first conductive pattern; and
 a third conductive pattern on the second conductive pattern, the third conductive pattern overlapping with the second conductive pattern and contacted to the second conductive pattern,
wherein one of the first conductive pattern and the second conductive pattern comprises:
 a first portion overlapping with the end portion of the corresponding signal line; and
 a second portion between the end portion of the corresponding signal line and an end portion of another signal line that is adjacent to the corresponding signal line from among the plurality of signal lines, the second portion extending from the first portion, and
wherein:
 the pad insulating layer overlaps with the electronic elements, the plurality of signal lines, and the first conductive pattern;

the pad insulating layer has a pad contact hole to expose at least a portion of the second conductive pattern; and the third conductive pattern is connected to the second conductive pattern through the pad contact hole.

2. The display device of claim 1, wherein the third conductive pattern is located within the pad contact hole in a plan view.

3. The display device of claim 1, further comprising:
a first insulating layer on the end portion of the corresponding signal line; and
a second insulating layer on the first conductive pattern, wherein:
the first insulating layer has a first contact hole to expose the end portion of the corresponding signal line;
the first conductive pattern is connected to the end portion of the corresponding signal line through the first contact hole;
the second insulating layer has a second contact hole to expose the first conductive pattern; and
the second conductive pattern is connected to the first conductive pattern through the second contact hole.

4. The display device of claim 3, wherein the first conductive pattern comprises the first portion and the second portion, and
the second contact hole overlaps with the second portion of the first conductive pattern in a plan view.

5. The display device of claim 3, wherein:
the second conductive pattern comprises the first portion and the second portion;
the second contact hole overlaps with the first conductive pattern and the first portion of the second conductive pattern in a plan view; and
the pad contact hole overlaps with the second portion of the second conductive pattern.

6. The display device of claim 1, further comprising:
a first insulating layer;
a second insulating layer;
a third insulating layer; and
a fourth insulating layer,
wherein:
each of the first, second, third, and fourth insulating layers is located under the pad insulating layer,
the plurality of electronic elements comprise an upper electrode, a transistor, and a light emitting element connected to the transistor,
the transistor comprises an active region, a gate on the active region, a source extending from one side of the active region, and a drain extending from another side of the active region,
the first insulating layer covers the active region, the source, and the drain,
the second insulating layer is on the first insulating layer and covers the gate,
the third insulating layer is on the second insulating layer and covers the upper electrode, and
the fourth insulating layer covers the third insulating layer.

7. The display device of claim 6, wherein the end portion is on a same layer as that of the gate or the upper electrode.

8. The display device of claim 6, wherein the first conductive pattern is on the third insulating layer, and the second conductive pattern is on the fourth insulating layer.

9. The display device of claim 6, wherein the pad insulating layer comprises an organic layer, the organic layer comprising a first portion between the end portion of the corresponding signal line and the end portion of the another signal line, and a second portion overlapping with the transistor, and
wherein a thickness of the first portion of the organic layer is in a range from about 45% to about 55% of a thickness of the second portion of the organic layer.

10. The display device of claim 6, wherein each of the first insulating layer, the second insulating layer, the third insulating layer, and the fourth insulating layer comprises an inorganic layer, and
wherein the pad insulating layer comprises an organic layer.

11. The display device of claim 1, further comprising a thin film encapsulation layer and an input sensor,
wherein:
the electronic elements comprise light emitting elements;
the thin film encapsulation layer is on the pad insulating layer and covers the light emitting elements; and
the input sensor is on the thin film encapsulation layer, the input sensor comprising sensing electrodes.

12. The display device of claim 11, wherein the plurality of signal lines comprise first signal lines connected to the light emitting elements, and second signal lines connected to the sensing electrodes.

13. The display device of claim 1, wherein the plurality of signal lines comprise a plurality of portions on different layers.

14. The display device of claim 1, wherein:
the plurality of signal pads comprise first signal pads and second signal pads;
the first signal pads form a first pad row;
the second signal pads form a second pad row different from the first pad row; and
the second signal pads are in a staggered arrangement with respect to the first signal pads.

15. The display device of claim 14, wherein the second signal pads are closer to an edge of the base layer than the first signal pads, and
a signal line connected to one of the second signal pads from among the plurality of signal lines overlaps with a second portion of a corresponding first signal pad from among the first signal pads.

16. The display device of claim 14, wherein an end portion of a signal line connected to one of the second signal pads from among the plurality of signal lines is on a layer different from a layer at which an end portion of a signal line connected to one of the first signal pads from among the plurality of signal lines is on.

17. The display device of claim 1, further comprising:
a circuit board electrically connected to the plurality of signal pads; and
an anisotropic conductive film configured to couple the plurality of signal pads to the circuit board.

18. A display device comprising:
a first signal line;
a second signal line;
a first signal pad connected to the first signal line;
a second signal pad connected to the second signal line; and
a pad insulating layer overlapping with the first signal line and the second signal line,
wherein the first signal pad comprises:
an intermediate conductive pattern overlapping with an end portion of the first signal line, the intermediate conductive pattern being connected to the end portion of the first signal line; and an upper conductive pattern on the intermediate conductive pattern, the upper conductive pattern being exposed through the pad insulating layer, wherein the intermediate conductive pattern comprises a first portion overlapping with the end portion of the first signal line, and a second portion between the end portion of the first signal line and an end portion of the second signal line, the second portion extending from the first portion, and wherein the upper conductive pattern is connected to the second portion of the intermediate conductive pattern.

19. The display device of claim 18, wherein the upper conductive pattern does not overlap with each of the end portion of the first signal line and the end portion of the second signal line.

20. A display device comprising:

a base layer comprising a display area and a non-display area;

a first switching transistor on the display area;

a second switching transistor on the display area;

a first signal line connected to the first switching transistor;

a second signal line connected to the second switching transistor;

a first signal pad connected to the first signal line;

a second signal pad connected to the second signal line; and a pad insulating layer overlapping with the first switching transistor, the second switching transistor, the first signal line, and the second signal line, wherein each of the first signal pad and the second signal pad comprises:

an intermediate conductive pattern overlapping with an end portion of a corresponding signal line from among the first signal line and the second signal line, the intermediate conductive pattern being electrically connected to the end portion of the corresponding signal line; and an upper conductive pattern on the intermediate conductive pattern, the upper conductive pattern being exposed through the pad insulating layer, wherein the pad insulating layer has a pad contact hole to expose a portion of the intermediate conductive pattern, the pad contact hole overlapping with the end portion of the corresponding signal line, and wherein the upper conductive pattern is connected to the intermediate conductive pattern through the pad contact hole, the upper conductive pattern being located within the pad contact hole in a plan view.

21. The display device of claim 20, wherein the pad insulating layer comprises an organic layer, the organic layer comprising a first portion between the first signal pad and the second signal pad, and a second portion overlapping with the first switching transistor, and wherein a thickness of the first portion of the organic layer is in a range from about 60% to about 80% of a thickness of the second portion of the organic layer.

22. The display device of claim 20, wherein the pad insulating layer comprises a first organic layer, at least one inorganic layer on the first organic layer, and a second organic layer on the at least one inorganic layer, wherein the first organic layer comprises a first portion between the first signal pad and the second signal pad, and a second portion overlapping with the first switching transistor, and wherein a thickness of the first portion of the first organic layer is in a range from about 45% to about 55% of a thickness of the second portion of the first organic layer.

23. The display device of claim 20, wherein the pad insulating layer comprises at least one inorganic layer and an organic layer on the at least one inorganic layer, and wherein an upper surface of a portion between the first signal pad and the second signal pad of the organic layer is higher than an uppermost end of the upper conductive pattern.

* * * * *